(12) United States Patent
Horio et al.

(10) Patent No.: US 9,312,192 B2
(45) Date of Patent: Apr. 12, 2016

(54) SEMICONDUCTOR DEVICE

(71) Applicant: FUJI ELECTRIC CO., LTD., Kawasaki-shi (JP)

(72) Inventors: Masafumi Horio, Matsumoto (JP); Hideyo Nakamura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/455,098

(22) Filed: Aug. 8, 2014

(65) Prior Publication Data

US 2014/0361424 A1    Dec. 11, 2014

Related U.S. Application Data

(63) Continuation of application No. PCT/JP2013/001805, filed on Mar. 15, 2013.

(30) Foreign Application Priority Data

Mar. 28, 2012  (JP) .................................. 2012-072673
Aug. 21, 2012  (JP) .................................. 2012-182615

(51) Int. Cl.
*H01L 23/04*    (2006.01)
*H02M 7/00*    (2006.01)
(Continued)

(52) U.S. Cl.
CPC ............ *H01L 23/041* (2013.01); *H01L 23/043* (2013.01); *H01L 23/051* (2013.01);
(Continued)

(58) Field of Classification Search
CPC .. H01L 23/041; H01L 23/544; H01L 25/0655
USPC ....................................................... 257/704
See application file for complete search history.

(56) References Cited

U.S. PATENT DOCUMENTS 4,729,744 A    3/1988 Bet et al.
5,202,578 A    4/1993 Hideshima
(Continued)

FOREIGN PATENT DOCUMENTS

EP    2284889 A1    2/2011
JP    6286900 A    4/1987
(Continued)

OTHER PUBLICATIONS

International Search Report issued in PCT/JP2013/001805 mailed May 21, 2013.
(Continued)

*Primary Examiner* — Christine Enad
(74) *Attorney, Agent, or Firm* — Rossi, Kimms & McDowell LLP

(57) ABSTRACT

A semiconductor device includes: a plurality of semiconductor modules, each of which includes a semiconductor circuit having a circuit board on which at least one or more semiconductor chips are mounted; and a module storage case that accommodates the plurality of semiconductor modules which are arranged in parallel. In the module storage case, a plurality of pairs of positioning guide members, which position and guide the semiconductor modules, are formed on opposite surfaces forming a module storage region for accommodating the semiconductor modules so as to protrude inward and to face each other, so that a distance between the plurality of semiconductor modules in a longitudinal direction can be selected. A pair of fitting concave portions, which are fitted to the pair of positioning guide members, are formed at both ends of each semiconductor module in the longitudinal direction.

8 Claims, 17 Drawing Sheets

(51) Int. Cl.
*H05K 7/20* (2006.01)
*H01L 25/07* (2006.01)
*H01L 23/00* (2006.01)
*H01L 23/043* (2006.01)
*H01L 23/051* (2006.01)
*H01L 23/40* (2006.01)
*H01L 23/544* (2006.01)
*H01L 25/065* (2006.01)
*H01L 25/18* (2006.01)
*H01L 23/538* (2006.01)
*H01L 23/373* (2006.01)
*H01L 23/433* (2006.01)

(52) U.S. Cl.
CPC .......... *H01L23/4006* (2013.01); *H01L 23/544* (2013.01); *H01L 24/18* (2013.01); *H01L 25/0655* (2013.01); *H01L 25/072* (2013.01); *H02M 7/003* (2013.01); *H05K 7/209* (2013.01); *H01L 23/3735* (2013.01); *H01L 23/4334* (2013.01); *H01L 23/5385* (2013.01); *H01L 25/18* (2013.01); *H01L 2023/405* (2013.01); *H01L 2924/01322* (2013.01); *H01L 2924/12042* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 5,408,128 | A | 4/1995 | Furnival |
| 5,927,504 | A * | 7/1999 | Han et al. ............ 206/706 |
| 8,526,199 | B2 * | 9/2013 | Matsumoto et al. ......... 361/820 |
| 2004/0248330 | A1 | 12/2004 | Kitabatake et al. |
| 2005/0093137 | A1 * | 5/2005 | Ishikawa et al. ............ 257/712 |
| 2007/0183130 | A1 | 8/2007 | Yamabuchi et al. |
| 2007/0242584 | A1 * | 10/2007 | Chan ............ 369/59.11 |
| 2008/0284007 | A1 * | 11/2008 | Horio et al. ............ 257/734 |
| 2008/0290506 | A1 | 11/2008 | Aoki et al. |
| 2010/0039843 | A1 | 2/2010 | Takizawa |
| 2010/0127371 | A1 | 5/2010 | Tschirbs |
| 2010/0128441 | A1 | 5/2010 | Soda et al. |
| 2010/0149774 | A1 | 6/2010 | Matsumoto et al. |
| 2011/0203967 | A1 * | 8/2011 | Staroveck ............ 206/710 |
| 2011/0273861 | A1 * | 11/2011 | Matsumoto et al. ......... 361/820 |
| 2012/0008286 | A1 * | 1/2012 | Suzuki ............ 361/730 |
| 2012/0241953 | A1 | 9/2012 | Yamada et al. |
| 2012/0256194 | A1 * | 10/2012 | Yoshihara et al. ............ 257/77 |
| 2013/0062751 | A1 | 3/2013 | Takagi et al. |
| 2013/0154081 | A1 * | 6/2013 | Kadoguchi et al. ........... 257/712 |
| 2014/0210067 | A1 * | 7/2014 | Takamiya et al. ............ 257/698 |

FOREIGN PATENT DOCUMENTS

| | | |
|---|---|---|
| JP | 04133391 A | 5/1992 |
| JP | 05094854 A | 4/1993 |
| JP | 05218252 A | 8/1993 |
| JP | 06013539 A | 1/1994 |
| JP | 07123738 A | 5/1995 |
| JP | 07240497 A | 9/1995 |
| JP | 10093016 A | 4/1998 |
| JP | 2001036005 A | 2/2001 |
| JP | 3430192 B2 | 7/2003 |
| JP | 2003289130 A | 10/2003 |
| JP | 2004289103 A | 10/2004 |
| JP | 2005065414 A | 3/2005 |
| JP | 2006081308 A | 3/2006 |
| JP | 2006081312 A | 3/2006 |
| JP | 2006332291 A | 12/2006 |
| JP | 2007194442 A | 8/2007 |
| JP | 2007209184 A | 8/2007 |
| JP | 4129027 B2 | 7/2008 |
| JP | 2008193779 A | 8/2008 |
| JP | 2008294069 A | 12/2008 |
| JP | 2010103222 A | 5/2010 |
| JP | 2010103343 A | 5/2010 |
| JP | 2010245096 A | 10/2010 |
| JP | 2010251772 A | 11/2010 |
| JP | 2011233606 A | 11/2011 |
| WO | 2008142758 A1 | 11/2008 |
| WO | 2011083737 A1 | 7/2011 |
| WO | WO 2012029164 A1 * | 3/2012 |

OTHER PUBLICATIONS

Extended European Search Report issued in EP13770136.3, mailed Nov. 10, 2015.
International Search Report issued in PCT/JP2013/056634, mailed Jun. 11, 2013.
Office Action issued in U.S. Appl. No. 14/455,184, mailed Oct. 19, 2015.
International Search Report issued in PCT/JP2013/001804, mailed May 21, 2013.
Office Action issued in U.S. Appl. No. 14/455,129, mailed Aug. 5, 2015.
Office Action issued in JP2014-507624, mailed Dec. 1, 2015. English translation provided.
Extended European Search Report issued in EP13770354.2, mailed Dec. 16, 2015.
Extended European Search Report issued in EP13769080.6, mailed Dec. 17, 2015.

* cited by examiner

SEMICONDUCTOR DEVICE

CROSS REFERENCE TO RELATED APPLICATIONS

This application is a continuation of International Application No. PCT/JP2013/001805, filed on Mar. 15, 2013, which is based on and claims priority to Japanese Patent Application No. JP 2012-072673, filed on Mar. 28, 2012 and Japanese Patent Application No. JP 2012-182615, filed on Aug. 21, 2012. The disclosure of the Japanese priority applications and the PCT application in their entirety, including the drawings, claims, and the specification thereof, are incorporated herein by reference.

BACKGROUND

1. Field of the Invention

Embodiments of the present invention relate to a semiconductor device formed by a plurality of semiconductor modules including, for example, a power device.

2. Discussion of the Background

A power conversion inverter device has been widely used as one of power conversion devices. For example, an electric motor is generally used as a driving source of, for example, an electric vehicle or a hybrid vehicle. An inverter device is generally used to control various types of motors. As the power conversion device, a semiconductor module is used in which a power device, such as an insulated gate bipolar transistor (IGBT) or a free-wheeling diode (FWD), is sealed in a predetermined shape with a mold resin material. A plurality of semiconductor modules are combined to form a power conversion device.

A module-type electric device block has been proposed which includes a mutual coupling means. In the module-type electric device block, when two module-type blocks, such as mold cases which surround an electric device, are arranged and connected to each other, the two mold cases are coupled in a hinge manner. When one of the two cases is pivoted to come into contact with the other case, a protruding end of a tongue-shaped portion which is provided in one case is fitted to the outer surface of the other case to couple the two mold cases (for example, see JP 62-86900 A) ("Patent Document 1").

As another attachment method, an inverter device has been proposed in which six main switching elements, which are modules forming one arm of the inverter device, are prepared, are divided into three sets each having two main switching elements, and the main switching elements in each set are connected by a U-phase main circuit board, a V-phase main circuit board, and a W-phase main circuit board (for example, see JP 3430192 B1) ("Patent Document 2").

As another attachment method, a semiconductor device has been proposed in which three semiconductor modules are mounted on the upper surface of a heat sink, a reinforcing beam is arranged on the upper surface of the semiconductor module, with a leaf spring which traverses each semiconductor module interposed therebetween, and screws are inserted from the upper side of the reinforcing beam into the heat sink through the leaf spring and the semiconductor module to fix the three semiconductor modules to the heat sink (for example, see JP 4129027 B1) ("Patent Document 3").

A semiconductor device has been proposed in which three columns of semiconductor device units in which a semiconductor chip is sealed with a resin, each column having two semiconductor device units, are arranged on a cooler; bolt tightening units are provided at both ends of each semiconductor device unit in the row direction; a wiring substrate is arranged on the upper surfaces of each semiconductor device unit and each bolt fastening unit; and bolts are inserted into the cooler through the bolt tightening units from the upper side of the wiring substrate to fix the semiconductor device units to the cooler (for example, see WO 2011/083737 A) ("Patent Document 4").

However, in the related art disclosed in Patent Document 1, two mold cases having the electric devices provided therein are coupled to each other by the mutual coupling means including the hinge portion and the tongue-shaped portion. However, in this case, there is an unsolved problem that it is difficult to connect the two mold cases, with a desired gap therebetween, considering, for example, cooling efficiency.

In the related art disclosed in Patent Document 2, three main elements for an upper arm and three main element for a lower arm, which form the inverter device, are individually screwed to the radiation fin, the individual main circuit boards are mounted on the upper surfaces of the corresponding main elements for an upper arm and the corresponding main elements for a lower arm, the terminal portions are fixed to each other by screws, and each main circuit board is connected to a power board by a connector. Therefore, in Patent Document 2, there is an unsolved problem that the arrangement position of each main circuit board is determined by the power board and it is difficult to set the distance between the main circuit boards, that is, the distance between the main element for an upper arm and the main element for a lower arm which are adjacent to each other to a desired value, considering, for example, cooling efficiency.

In the related art disclosed in Patent Document 3, three semiconductor module, the leaf spring for pressure, and the reinforcing beam are arranged on the heat sink and are fixed to the heat sink by bolts. Therefore, in Patent Document 3, there is an unsolved problem that it is difficult to set the distance between the semiconductor modules to a desired value, considering, for example, cooling efficiency.

In the related art disclosed in Patent Document 4, six semiconductor device units are interposed between the bolt fastening units, the wiring substrate covers the semiconductor device units and the bolt fastening units, and the bolts are inserted into the cooler through the bolt fastening units from the upper side of four corners of the wiring substrate to fix the semiconductor device units to the cooler. Therefore, in Patent Document 4, there is an unsolved problem that the arrangement of the six semiconductor device units is determined by the wiring substrate and it is difficult to set the distance between the semiconductor device units to a desired value, considering, for example, cooling efficiency.

SUMMARY

Embodiments of the invention provide a semiconductor device in which a distance between adjacent semiconductor modules among a plurality of semiconductor modules can be adjusted and the semiconductor modules can be easily attached.

According to a first aspect of the invention, a semiconductor device includes: a plurality of semiconductor modules each of which includes a semiconductor circuit having a circuit board on which at least one or more semiconductor chips are mounted; and a module storage case that accommodates the plurality of semiconductor modules which are arranged in parallel. A plurality of pairs of positioning guide members which position and guide the semiconductor modules are formed on opposite surfaces of the module storage case, which form a module storage region for accommodating the semiconductor modules, so as to protrude inward and to face each other, so that the distance between the plurality of semiconductor modules in a longitudinal direction can be selected. In addition, a pair of fitting concave portions which are fitted to the pair of positioning guide members are formed at both ends of each semiconductor module in the longitudinal direction.

According to a second aspect of the invention, in the semiconductor device according to the above-mentioned aspect, cap insertion concave portions may be formed in one surface of each of the plurality of semiconductor modules at both ends in the longitudinal direction. An attachment hole into which a fixing tool is inserted may be formed in the bottom of the cap insertion concave portion so as to extend to the other surface. An insulating cap which ensures an insulation distance of the fixing tool may be fitted to the cap insertion concave portion. The fitting concave portion which is fitted to the positioning guide member may be formed in the insulating cap.

According to a third aspect of the invention, in the semiconductor device according to the above-mentioned aspect, the insulating cap may include an inner cylindrical portion that is fitted to the cap insertion concave portion and has two open ends and an outer cylindrical portion that is connected to the outside of the inner cylindrical portion, is formed coaxially with the inner cylindrical portion, and has an open lower end. The fitting concave portion may be formed in the outer cylindrical portion.

According to a fourth aspect of the invention, in the semiconductor device according to the above-mentioned aspect, a fitting protrusion of the module storage case may include a snap-fitting convex portion that is formed at a position corresponding to an opening portion of the outer cylindrical portion of the insulating cap. A snap-fitting concave portion which is fitted to the snap-fitting convex portion may be formed in the fitting concave portion of the outer cylindrical portion of the insulating cap.

According to a fifth aspect of the invention, in the semiconductor device according to the above-mentioned aspect, the module storage case may accommodate the plurality of semiconductor modules such that a heat dissipation portion which is formed in each of the plurality of semiconductor modules faces the opening portion. The fixing tools may be inserted into the attachment holes of the semiconductor modules, which correspond to attachment insertion holes, through the attachment insertion holes, with the heat dissipation portions coming into contact with a cooler, to fix the plurality of semiconductor modules to the cooler.

According to embodiments of the invention, it is possible to set the distance between adjacent semiconductor modules having to semiconductor chips provided therein to a desired value to easily accommodate a plurality of semiconductor modules in a module storage case and to easily replace the semiconductor modules. Therefore, it is possible to improve flexibility in the layout of the semiconductor modules, considering, for example, cooling efficiency.

DESCRIPTION OF ILLUSTRATED EMBODIMENTS

Hereinafter, embodiments of the invention will be described with reference to the drawings.

Figure 1:
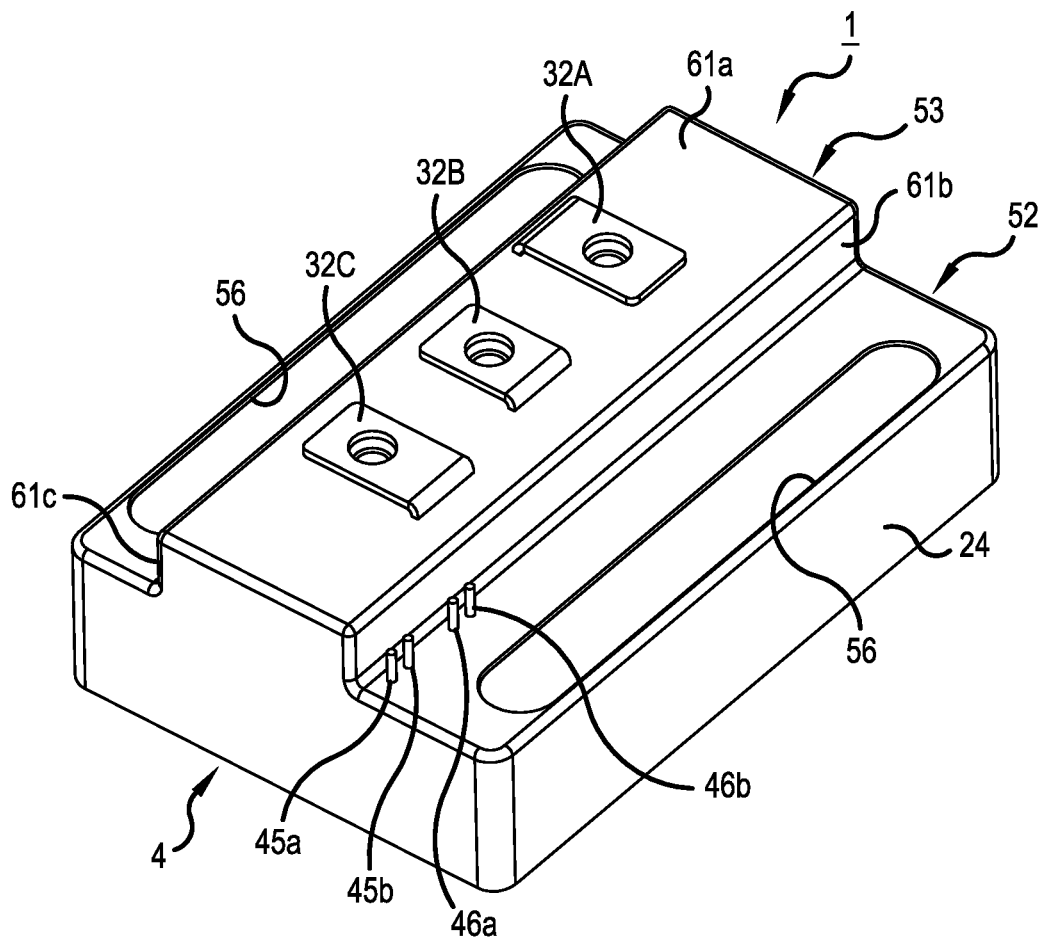
FIG. 1 is a perspective view illustrating the top side of a semiconductor device according to a first embodiment of the invention.
Figure 2:
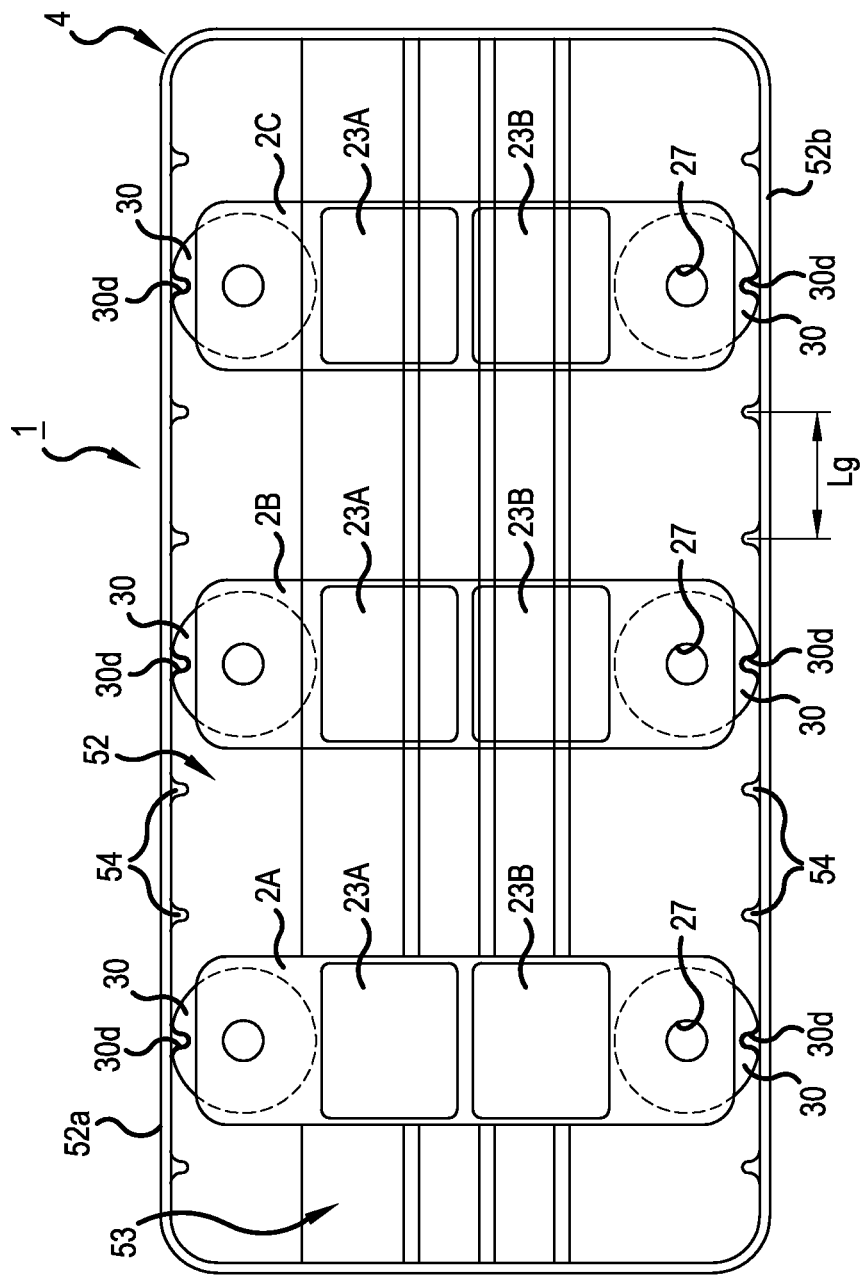
FIG. 2 is a bottom view illustrating the semiconductor device illustrated in FIG. 1.
Figure 3:
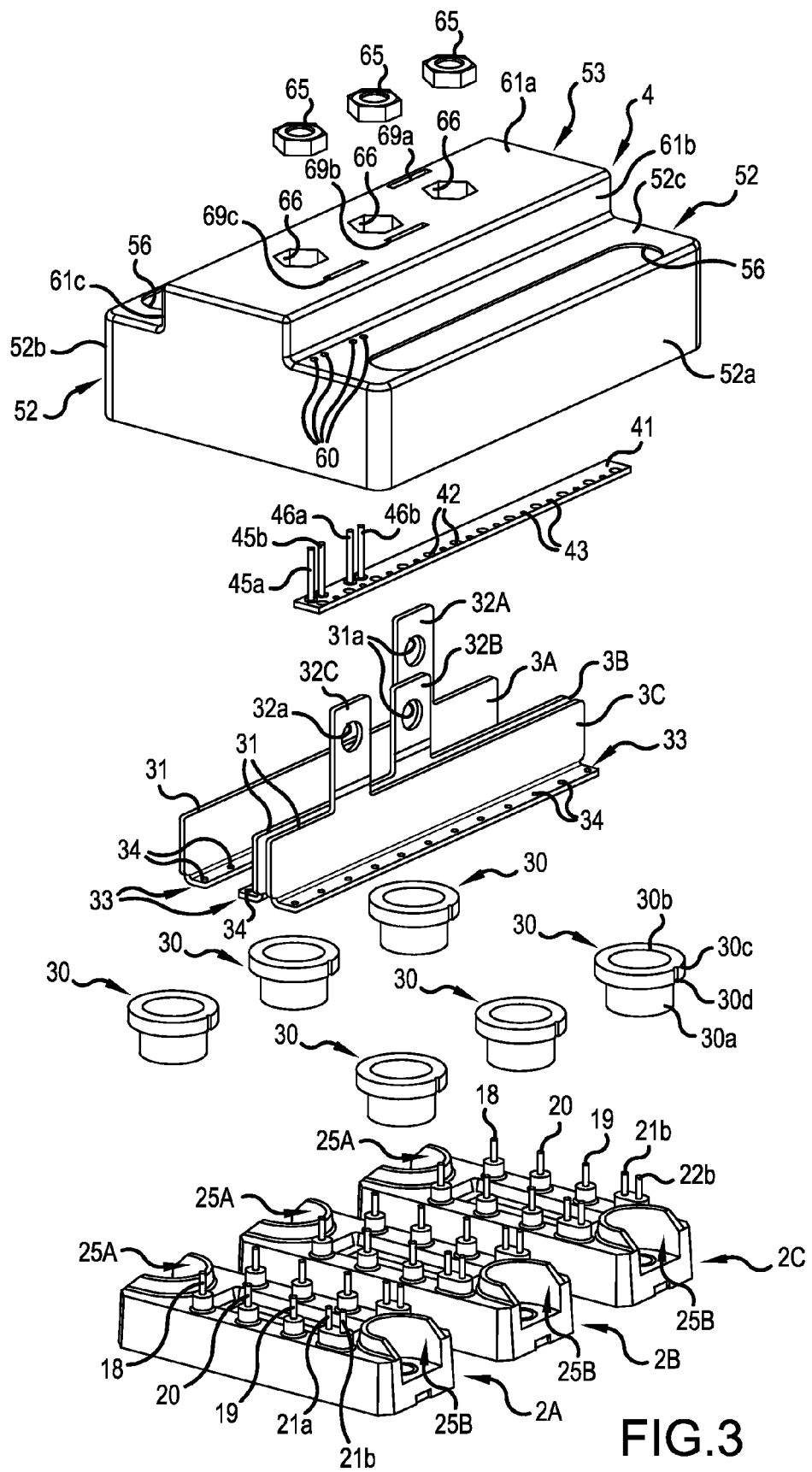
FIG. 3 is an exploded perspective view illustrating the semiconductor device.
Figure 4:
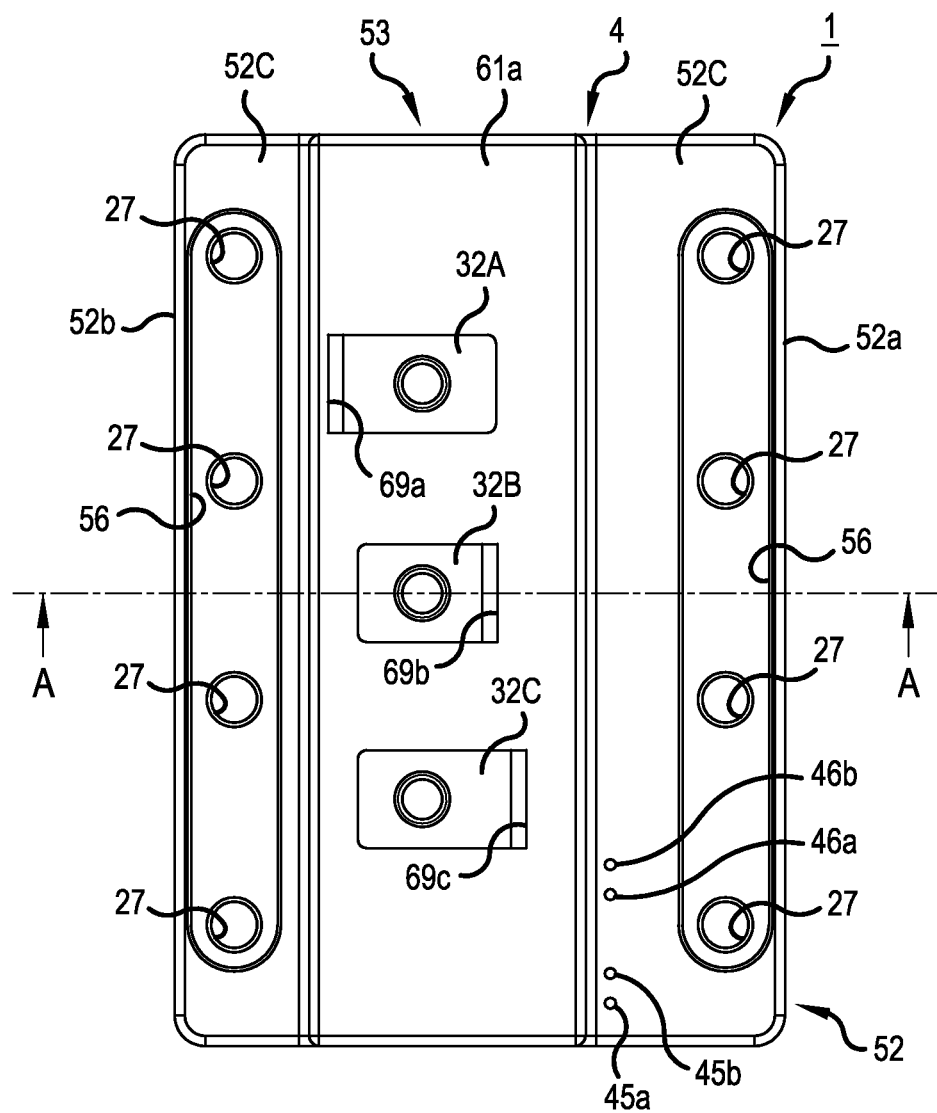
FIG. 4 is a plan view illustrating the semiconductor device.
Figure 5:
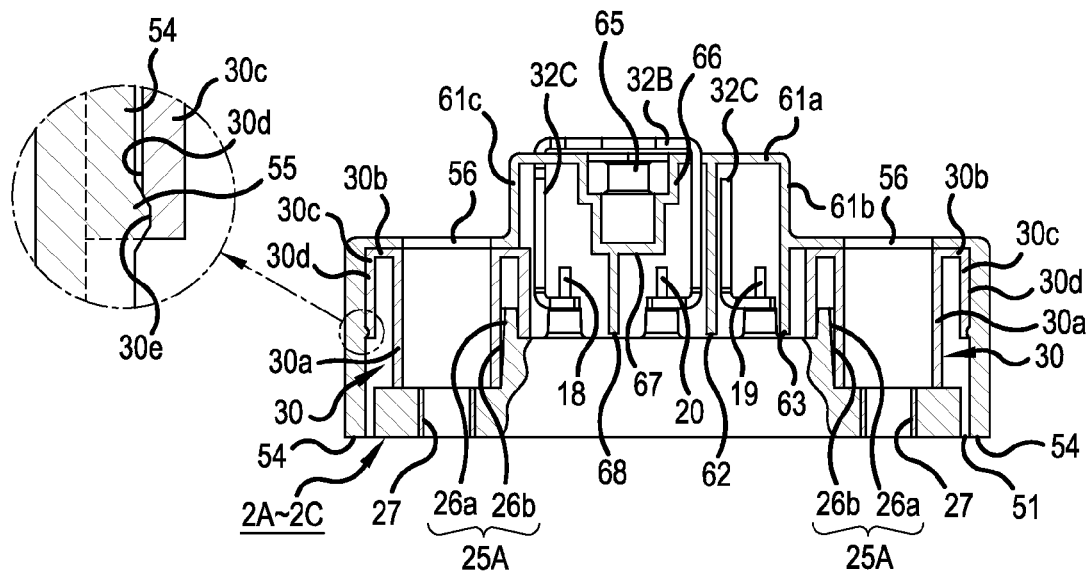
FIG. 5 is a cross-sectional view taken along the line A-A of FIG. 4.

FIG. 1 is a perspective view illustrating the top side of a semiconductor device according to an embodiment of the invention and FIG. 2 is a bottom view illustrating the semiconductor device. FIG. 3 is an exploded perspective view illustrating the semiconductor device, FIG. 4 is a plan view illustrating the semiconductor device, and FIG. 5 is a cross-sectional view taken along the line A-A of FIG. 4. As illustrated in FIG. 3, a semiconductor device 1 includes a plurality of power semiconductor modules, for example, three power semiconductor modules 2A to 2C, three main terminal plates 3A to 3C which individually connect connection terminals of the power semiconductor modules 2A to 2C, and a module storage case 4 which accommodates the power semiconductor modules 2A to 2C and the main terminal plates 3A to 3C.

Figure 10:
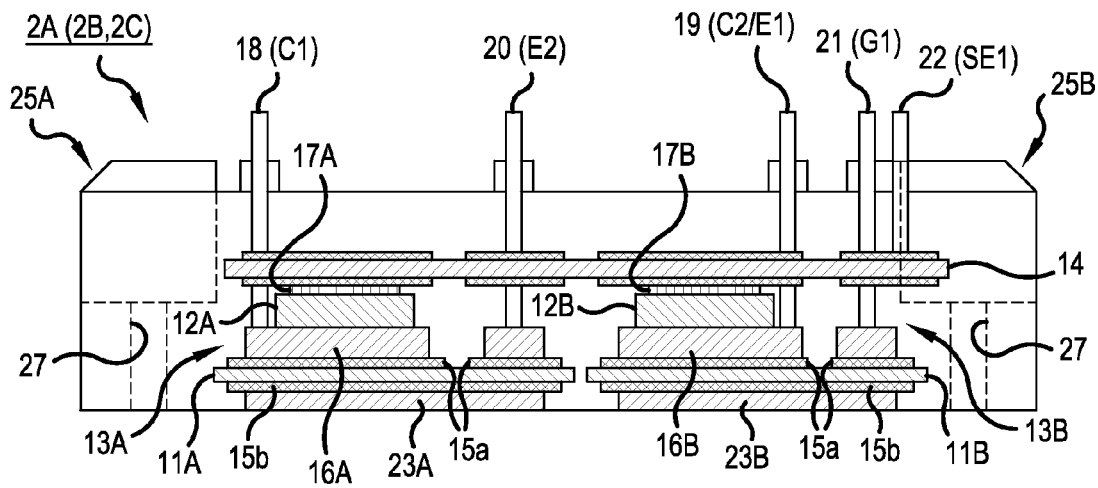
FIG. 10 is a cross-sectional view illustrating the internal structure of the power semiconductor module.

As can be seen from FIG. 10, an example of each of the power semiconductor modules 2A to 2C includes two semiconductor circuits 13A and 13B which are respectively formed by mounting semiconductor chips 12A and 12B on insulating substrates 11A and 11B and a wiring substrate 14 which forms a common wiring circuit on the upper side of the semiconductor circuits 13A and 13B. In the semiconductor circuits 13A and 13B, the semiconductor chips 12A and 12B are power devices, such as insulated gate bipolar transistors (IGBTs), power metal-oxide-semiconductor field-effect transistors (MOSFET), or free wheeling diodes (FWDs).

For ease of understanding of illustration, in FIG. 10, only one semiconductor chip 12A and only one semiconductor chip 12B are respectively provided on one insulating substrate 11A and one insulating substrate 11B. However, in practice, a switching device, such as an IGBT, and an FWD are provided on a conductor layer which is provided on the front surface side of each of the insulating substrates 11A and 11B and are connected as illustrated in an equivalent circuit of FIG. 11. The semiconductor chips 12A and 12B are various types of power devices. The semiconductor chips 12A and 12B may be formed on a silicon substrate or a SiC substrate.

The insulating substrates 11A and 11B are made of ceramics, such as alumina with high conductivity, and copper films 15a and 15b forming conductor layers are attached to the front and rear surfaces of the insulating substrates 11A and 11B. A predetermined circuit pattern for connecting a plurality of power devices which are provided on the conductor layer (copper film 15a) is formed in the conductor layer provided on the front surface of the insulating substrate 11A. The semiconductor chip 12A is provided on the copper film 15a on the front surface of the insulating substrate 11A, with a copper block 16A interposed therebetween. Similarly, a predetermined circuit pattern for connecting a plurality of power devices which are provided on the conductor layer is formed in the copper film 15a provided on the front surface of the insulating substrate 11B. The semiconductor chip 12B is provided on the copper film 15a on the front surface of the insulating substrate 11B, with a copper block 16B interposed therebetween.

Figure 11:
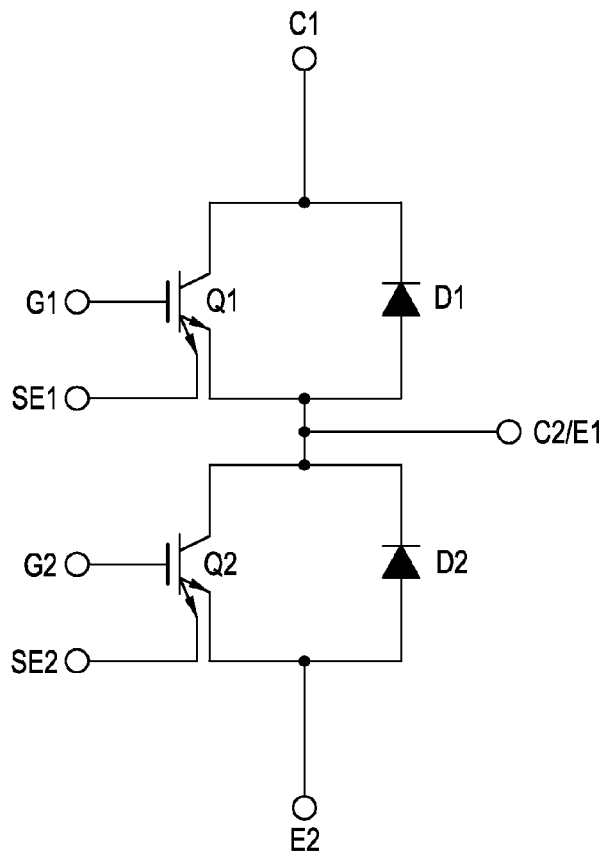
FIG. 11 is a circuit diagram illustrating an equivalent circuit of the power semiconductor module.

As can be seen from the equivalent circuit diagram illustrated in FIG. 11, an inverse parallel circuit of a switching device (hereinafter, simply referred to as a transistor) Q1 and an FWD (hereinafter, referred to as a diode) D1 and an inverse parallel circuit of a transistor Q2 and a diode D2 are connected in series to the copper films 15a and 15b of the insulating substrates 11A and 11B, respectively. The semiconductor chip (power device) which is provided on one insulating substrate 11A or 11B may equivalently form the inverse parallel circuit of the transistor and the diode illustrated in FIG. 11. Therefore, the transistor or/and the diode may be provided with a plurality of semiconductor chips with the same rating.

FIG. 10 illustrates a state in which the semiconductor chip 12A forming the transistor Q1 and a semiconductor chip (not illustrated), which forms the diode D1 and is arranged on the rear side of the semiconductor chip 12A, are arranged on the copper film 15a of the insulating substrate 11A in the front-rear direction. Similarly, the semiconductor chip 12B forming the transistor Q2 and a semiconductor chip (not illustrated), which forms the diode D1 and is arranged on the rear side of the semiconductor chip 12B, are arranged on the copper film 15a of the insulating substrate 11B in the front-rear direction. That is, the transistor Q1 and the diode D1 are connected in inverse parallel by the copper film 15a on the insulating substrate 11A and the wiring substrate 14, and the transistor Q2 and the diode D2 are connected in inverse parallel by the copper film 15a on the insulating substrate 11B and the wiring substrate 14. Two inverse parallel circuits formed by a pair of the transistor Q1 and the diode D1 and a pair of the transistor Q2 and the diode D2 are connected in series to the wiring substrate 14 which is provided above the inverse parallel circuits, through post-shaped electrode members 17A and 17B, respectively.

Two semiconductor chips 12A may not be arranged in the front-rear direction on the copper film 15a of the insulating substrate 11A unlike FIG. 10, but may be arranged in a line in the left-right direction on the copper film 15a of the insulating substrate 11A. In addition, similarly, two semiconductor chips 12B may be arranged in a line in the left-right direction.

Here, a collector electrode of the transistor Q1 is formed on the lower surface of the semiconductor chip 12A and is connected to a pin-shaped conductor (pin terminal) 18 through the copper block 16A. The pin-shaped conductor 18 is a main terminal (collector terminal C1) of each of the power semiconductor modules 2A to 2C. A collector electrode of the transistor Q2 is formed on the rear surface of the semiconductor chip 12B and is connected to a pin-shaped conductor (pin terminal) 19 through the copper block 16B. The pin-shaped conductor 19 is a main terminal (collector/emitter terminal C2/E1) of each of the power semiconductor modules 2A to 2C. The emitter electrodes and the gate electrodes of the transistors Q1 and Q2 are formed on the front surfaces of the semiconductor chips 12A and 12B and are connected to the wiring substrate 14 through the electrode members 17A and 17B, respectively. Among the emitter electrodes and the gate electrodes, the emitter electrode of the transistor Q1 is connected to the pin-shaped conductor (pin terminal) 19 through the wiring substrate 14, and the emitter electrode of the transistor Q2 is connected to a pin-shaped conductor (pin terminal) 20 through the wiring substrate 14. The pin-shaped conductor 20 is a main terminal (emitter terminal E2) of each of the power semiconductor modules 2A to 2C. The pin-shaped conductors 18, 19, and 20 are all connection terminals for connection to strip-shaped terminal plate bodies, which will be described below.

Figure 6:
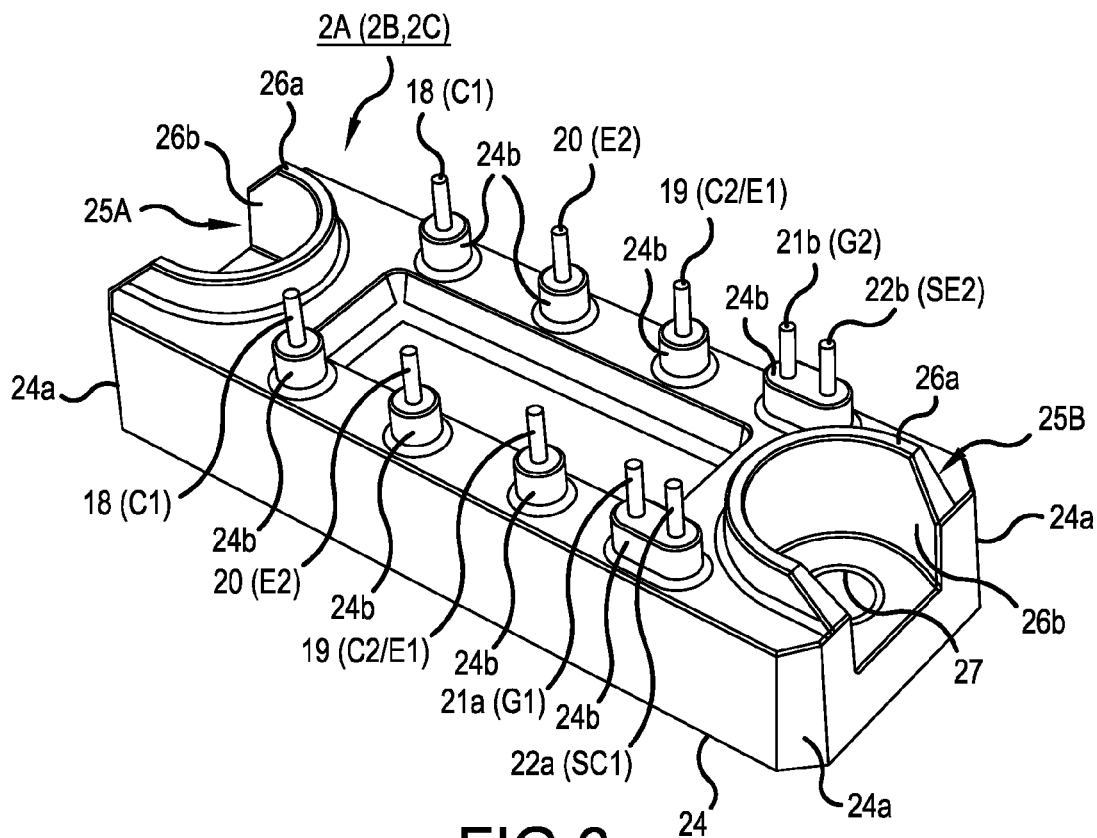
FIG. 6 is a perspective view illustrating the top side of a power semiconductor module.

As illustrated in FIG. 6, two pin-shaped conductors 18, two pin-shaped conductors 19, and two pin-shaped conductors 20 are symmetrically formed with respect to the center line of each of the power semiconductor modules 2A to 2C in the width direction. Each of the power semiconductor modules 2A to 2C includes a total of four pin-shaped conductors (pin terminals) 21a, 21b, 22a, and 22b which are provided outside the pin-shaped conductors 19 in the longitudinal direction. The pin-shaped conductors 21a and 21b are connected to the wiring substrate 14 and form gate terminals G1 and G2 which supply gate control signals to the gate electrodes of the transistors Q1 and Q2 of a half-bridge circuit, respectively. The other two pin-shaped conductors 22a and 22b are control (auxiliary) terminals and form a sense collector terminal SC1 and a sense emitter terminal SE2 which are respectively connected to the collector of the transistor Q1 and the emitter of the transistor Q2, sense a current flowing between the collector and the emitter of the transistors Q1 and Q2, and output sense signals.

Figure 7:
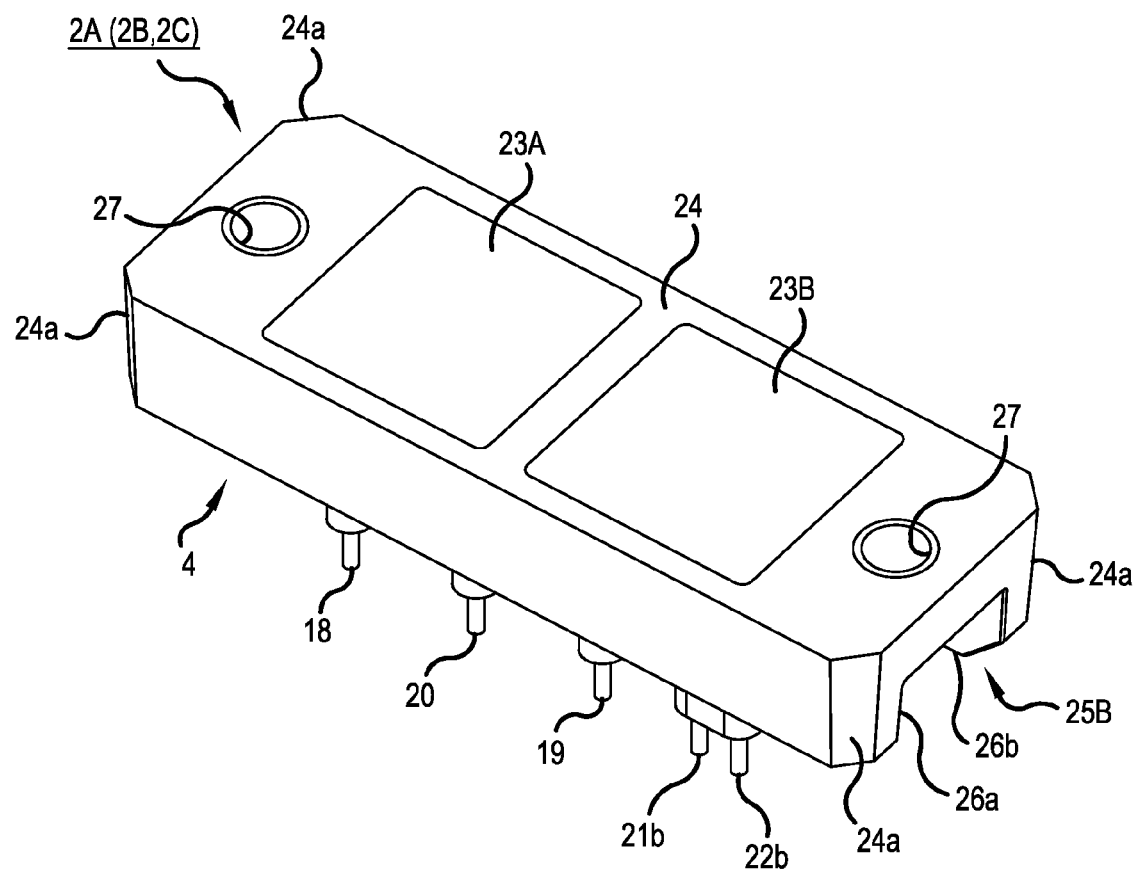
FIG. 7 is a perspective view illustrating the bottom side of the power semiconductor module.

As illustrated in FIG. 7, the pin-shaped conductors 18 to 20 for main terminals and the pin-shaped conductors 21a, 21b, 22a, and 22b for auxiliary terminals each protrude upward from an insulating base 24b having a truncated cone shape with a flat upper surface. The bottoms of connection terminal holding portions 33 of the main terminal plates 3A to 3C, which will be described below, come into contact with the upper surface of the insulating base 24b. As illustrated in FIGS. 7 and 10, copper blocks 23A and 23B with a square plate shape, which will be heat dissipation members, are connected to the copper films 15b on the rear surfaces of the insulating substrates 11A and 11B, respectively. The lower surfaces of the copper blocks 23A and 23B are flush with the bottom of each of the power semiconductor modules 2A to 2C or slightly protrude from the bottom.

Figure 8:
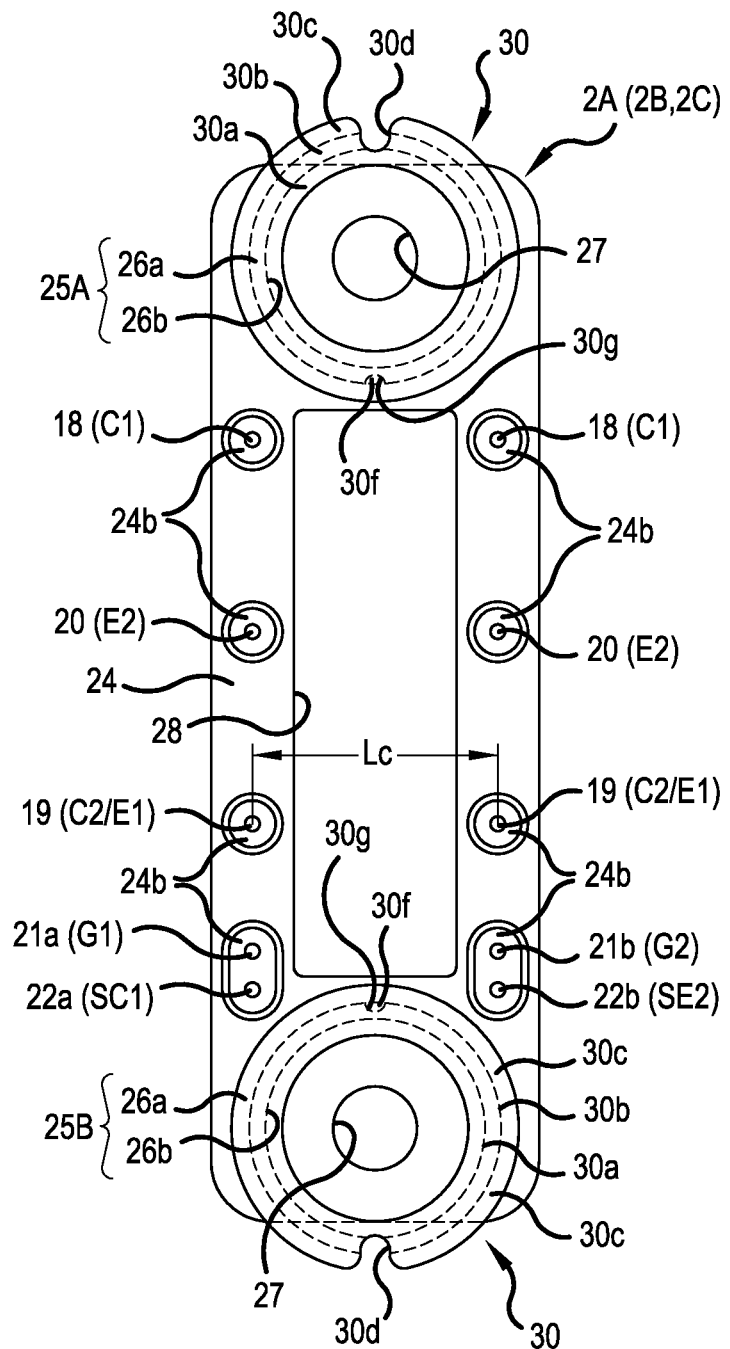
FIG. 8 is a plan view illustrating the power semiconductor module.

Each component of the power semiconductor modules 2A to 2C is formed of, for example, an epoxy resin material, which is a thermosetting resin, by molding and an element, such as a switching device or an FWD provided in the power semiconductor module, is protected. As a result, each of the power semiconductor modules 2A to 2C is formed as a molded body 24 with a rectangular parallelepiped shape. The molded body 24 has a rectangular shape as a whole in a plan view, as illustrated in FIGS. 6 to 8.

As illustrated in FIGS. 6 and 7, insulating wall portions 25A and 25B are formed at both ends of the molded body 24 in the longitudinal direction. Each of the insulating wall portions 25A and 25B includes a C-shaped protruding portion 26a which is formed inside the end surface of the molded body 24 in the longitudinal direction, protrudes from the surface, and has a larger angle than a semicylinder with a relatively large diameter and a cap insertion concave portion 26b which is connected to the inner circumferential surface of the C-shaped protruding portion 26a, extends to a depth corresponding to about half the thickness of the molded body 24, and has an open cylindrical inner surface with an open end.

An attachment hole 27, which has the central axis of the C-shaped protruding portion 26a as its center, is formed in the bottom of the cap insertion concave portion 26b forming in each of the insulating wall portions 25A and 25B so as to pass through the bottom of the molded body 24. Here, the inside diameter of the C-shaped protruding portion 26a of each of the insulating wall portions 25A and 25B is set to a value greater than the diameter of the head of a fixing tool, such as an attachment bolt or an attachment screw which is inserted into the attachment hole 27, and is also set to a wall surface height which can sufficiently ensure a creeping distance required between an adjacent pin-shaped conductor 18, 19, 21a, 21b, 22a, or 22b and the head of the fixing tool.

Insulating caps 30 are fitted to the insulating wall portions 25A and 25B. As illustrated in FIGS. 9(A) to 9(D), the insulating cap 30 includes an inner cylindrical portion 30a with a cylindrical shape which is fitted to the cap insertion concave portion 26b of each of the insulating wall portions 25A and 25B and has two open ends in the axial direction. In addition, the insulating cap 30 includes an outer cylindrical portion 30c with a cylindrical shape which is connected to the upper end of the inner cylindrical portion 30a through a connection portion 30b and has an open lower end.

As illustrated in FIG. 5, the insulating cap 30 is inserted by fitting the outer circumferential surface of the inner cylindrical portion 30a to the inner surface of the cap insertion concave portion 26b of each of the insulating wall portions 25A and 25B such that the C-shaped protruding portion 26a is interposed between the inner cylindrical portion 30a and the outer cylindrical portion 30c. As illustrated in FIG. 2, the insulating cap 30 includes a fitting concave portion 30d which is provided in the outer circumferential surface of the outer cylindrical portion 30c so as to extend in the axial direction and is fitted to a positioning guide member 54 that is formed on the inner surface of a module storage case 4, which will be described below, in the width direction. The positioning guide members 54 are arranged at predetermined intervals in the longitudinal direction. As illustrated in the enlarged view of FIG. 5, a snap-fitting concave portion 30e is formed in the vicinity of the lower end of the fitting concave portion 30d.

Figure 9A:
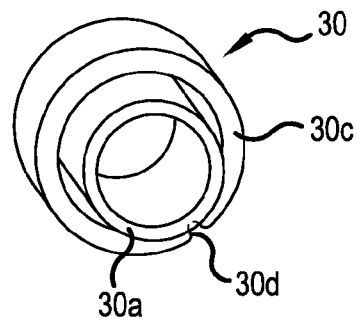
FIGS. 9(A), 9(B), 9(C), and 9(D) are perspective, plan, bottom, and front views, respectively, of an insulating cap.
Figure 9B:
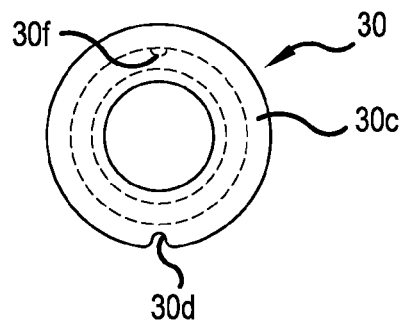
Figure 9C:
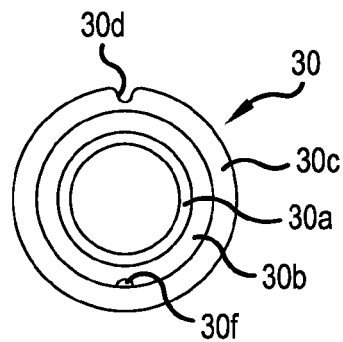
Figure 9D:
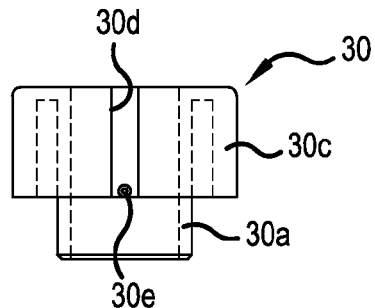

In addition, the insulating cap 30 includes a fitting convex portion 30f which is formed on the inner surface of the outer cylindrical portion 30c at a position that is opposite to the fitting concave portion 30d, with the central axis interposed therebetween, so as to extend in the axial direction, as represented by a dotted line in FIG. 9(B). The fitting convex portion 30f is fitted to a fitting concave portion 30g which is formed in the C-shaped protruding portion 26a of each of the power semiconductor modules 2A to 2C to stop the rotation of the insulating cap 30.

The main terminal plates 3A, 3B, and 3C are configured so as to individually connect the pin-shaped conductors 19, 20, and 18 when the three power semiconductor modules 2A to 2C are arranged in parallel at predetermined intervals as illustrated in FIG. 3, with the pin-shaped conductors 18 to 22b up. That is, the main terminal plates 3A to 3C include strip-shaped terminal plate bodies 31, bending plate portions 32A to 32C, and the connection terminal holding portions 33, respectively.

The terminal plate body 31 is a strip-shaped plate that extends in a direction in which it traverses the power semiconductor modules 2A to 2C which are arranged in parallel and has a surface parallel to the central axis of the attachment hole 27 in each of the power semiconductor modules 2A to 2C and the extension direction of the pin-shaped conductors 18 to 20, 21a, 21b, 22a, and 22b. Each of the bending plate portions 32A to 32C protrudes upward from the upper surface of the terminal plate body 31. A portion of the bending plate portion that protrudes from the module storage case 4, which will be described below, is bent and the bent portion becomes a main terminal segment. A bolt insertion hole 32a is formed in each of the bending plate portions 32A to 32C.

The connection terminal holding portion 33 protrudes from the lower surface of the terminal plate body 31 in one of the left and right directions. A plurality of insertion holes 34 into which the pin-shaped conductors 19, 20, and 18 of each of the power semiconductor modules 2A to 2C are inserted and held are formed in the connection terminal holding portion 33. The insertion holes 34 of the main terminal plates 3A, 3B, and 3C are formed such that the pin-shaped conductors 19, 20, and 18 are inserted into the insertion holes 34 when the power semiconductor modules 2A, 2B, and 2C are positioned and guided by each pair of positioning guide members 54 of the module storage case 4, which will be described below.

Figure 12:
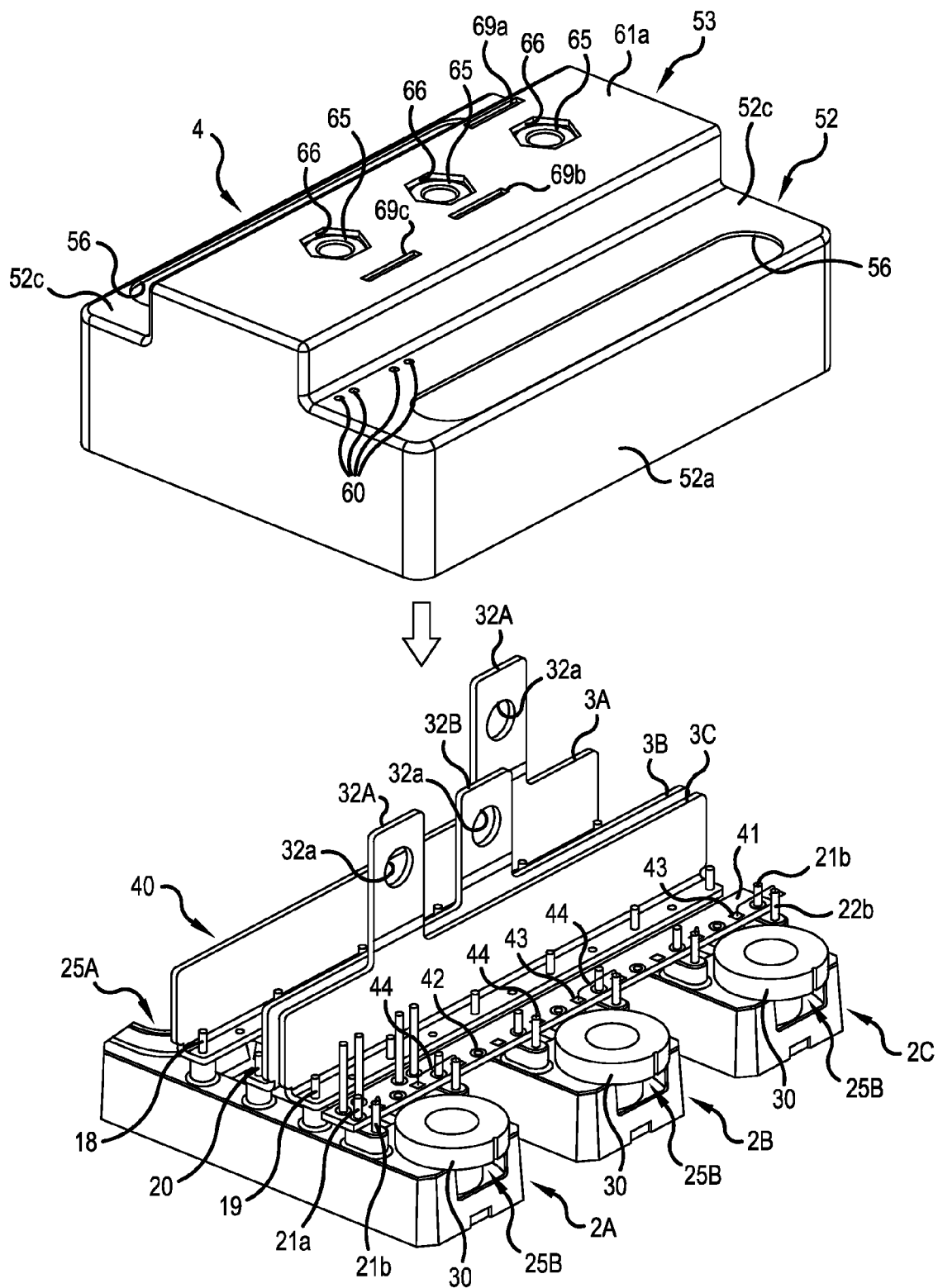
FIG. 12 is a perspective view illustrating a module storage case and a module aggregate formed by connecting the power semiconductor modules using main terminal plates.

As illustrated in FIG. 12, the power semiconductor modules 2A to 2C are arranged in parallel such that the distance between adjacent power semiconductor modules is a desired value, considering cooling efficiency, and the fitting concave portions 30d of the insulating caps 30 are fitted to each pair of positioning guide members 54 of the module storage case 4. In this state, the pin-shaped conductors 18 are inserted into the insertion holes 34 formed in the connection terminal holding portion 33 of the main terminal plate 3A. Similarly, the pin-shaped conductors 20 are inserted into the insertion holes 34 formed in the connection terminal holding portion 33 of the main terminal plate 3B. The pin-shaped conductors 19 are inserted into the insertion holes 34 formed in the connection terminal holding portion 33 of the main terminal plate 3C. Then, the bottom of each of the connection terminal holding portions 33 of the main terminal plates 3A to 3C comes into contact with the flat upper surface of the insulating base 24b to position the main terminal plates 3A to 3C and the power semiconductor modules 2A to 2C. In this state, the connection terminal holding portions 33 of the main terminal plates 3A to 3C are electrically connected to the pin-shaped conductors 19, 20, and 18. In this way, the power semiconductor modules 2A to 2C are connected to each other by the main terminal plates 3A to 3C to form a module aggregate 40.

When the main terminal plates 3A, 3B, and 3C and the pin-shaped conductors 18, 20 and 19 of the power semiconductor modules 2A to 2C are bonded to each other by, for example, lead (Pb)-free solder including tin (Sn), they are assembled in the shape illustrated in FIG. 12 and paste solder is applied to the pin-shaped conductors 18, 20, and 19 and is then heated. In the bonding, a general flow solder may be used or the following method may be used to perform strong bonding.

That is, the pin-shaped conductors 18, 20, and 19 may be made of a material with high conductivity, such as a copper (Cu)-based material or an aluminum (Al)-based material. However, when ease of soldering is considered, a surface treatment with a nickel (Ni) or tin-based material may be performed for the pin-shaped conductors 18, 20, and 19 to improve the wettability of soldering, thereby improving mounting efficiency.

In addition, an excited laser beam may be radiated to each of the pin-shaped conductors 18, 20, and 19 of the power semiconductor modules 2A to 2C in a spot manner to locally heat the pin-shaped conductors 18, 20, and 19, thereby bonding the main terminal plates 3A to 3C. In this case, for example, a silver (Ag) or gold (Au)-based alloy material may be used, in addition to the copper or aluminum-based material with high conductivity. When copper, aluminum, or silver is used, local diffusion bonding is performed between the components of the same type. However, when heat reception stability in a short time is considered, silver with high conductivity may be used. In addition, when gold is used, a tin-based film is formed on the surface of the pin terminal and the bonding of tin and gold materials is performed at a low melting point. Therefore, bonding power is less than that when copper, aluminum, or silver is used. In addition, after the material is solidified, a eutectic component of tin and gold forms a bonding portion. Therefore, heat resistance is expected to be higher than that in general soldering.

When the pin-shaped conductors 18, 20, and 19 in each of the power semiconductor modules 2A to 2C are connected to the main terminal plates 3A to 3C, the pin-shaped conductors 21a and 21b in each of the power semiconductor modules 2A to 2C are inserted into through holes 42 which are formed in a printed circuit board 41 illustrated in FIGS. 3 and 12. Then, the through holes 42 and the pin-shaped conductors 21a and 21b are electrically connected to each other by, for example, soldering. In addition, pads 43 formed in the printed circuit board 41 and the pin-shaped conductors 22a and 22b are electrically connected to each other by wire bonding using conductivity wires 44, as illustrated in FIG. 12.

Although not illustrated in the drawings, a conductive pattern for supplying a gate signal to the gate of the IGBT which is formed in each of the semiconductor chips 12A and 12B and a conductive pattern for outputting a sense current to the outside are formed on the printed circuit board 41. Pin-shaped external connection terminals 45a, 45b, 46a, and 46b are formed on the printed circuit board 41 so as to protrude from the surface of the printed circuit board 41. The external connection terminals 45a, 45b, 46a, and 46b are connected to the conductive pattern formed on the printed circuit board 41 and are electrically connected to the pin-shaped conductors 21a, 21b, 22a, and 22b in each of the power semiconductor modules 2A to 2C.

The module aggregate 40 in which a plurality of power semiconductor modules, for example, three power semiconductor modules 2A to 2C are integrated by the main terminal plates 3A to 3C is accommodated in the module storage case 4. As illustrated in FIGS. 2 to 5 and FIG. 12, the module storage case 4 is formed of a thermoplastic resin by injection molding and has a box shape which has a relatively small thickness, has flexibility, has a convex shape in a side view, and has an opening portion 51 as its lower end. The module storage case 4 includes a module storage region 52 which has a rectangular parallelepiped shape and into which the power semiconductor modules 2A to 2C are inserted and held through the opening portion 51 and a main terminal plate storage region 53 which protrudes upward from the center of the module storage region 52 in the front-rear direction and accommodates the main terminal plates 3A to 3C.

As illustrated in FIG. 2, a plurality of pairs of front and rear positioning guide members 54, for example, nine pairs of front and rear positioning guide members 54 are formed on the inner surfaces of the front and rear plates 52a and 52b in the module storage region 52 so as to extend in the up-down direction. The positioning guide members 54 forming each pair face each other such that the power semiconductor modules 2A to 2C can be individually accommodated at desired intervals. The pair of positioning guide members 54 are protrusions with a substantially triangular shape in a top view which can be fitted to the fitting concave portions 30d of the insulating caps 30 inserted into each of the power semiconductor modules 2A to 2C.

The pitch Lg between the pairs of positioning guide members 54 may be equal to the distance Lc between the centers of the pin-shaped conductors 18 to 20 of the power semiconductor modules 2A to 2C illustrated in FIG. 8. When the pitch between the positioning guide members 54 is set in this way, the positions of the pin-shaped conductors 18 to 20 of the power semiconductor modules 2$i$ (i=A to C) overlap each other in a state in which the power semiconductor modules 2$i$ are fitted to each pair of positioning guide members 54 and a state in which the power semiconductor modules 2$i$ are fitted to adjacent positioning guide members 54. Therefore, the number of insertion holes 34 formed in the connection terminal holding portion 33 of each of the main terminal plates 3A to 3C can be one less than the number of positioning guide members 54 and it is possible to reduce the number of insertion holes. Similarly, it is possible to reduce the number of through holes into which the pin-shaped conductors 21a, 21b, 22a, and 22b formed in the printed circuit board 41 are inserted and the number of pads.

However, when the pitch Lg between the pairs of positioning guide members 54 is equal to the distance Lc between the centers of the pin-shaped conductors 18 to 20 of the power semiconductor modules 2A to 2C, the minimum distance between two adjacent power semiconductor modules is less than the distance Lc between the centers of the pin-shaped conductors 18 to 20, but is a relatively long distance.

Therefore, the pitch Lg between the pairs of positioning guide members 54 may be equal to or greater than half the width of the power semiconductor module, in order to minimize the distance between adjacent power semiconductor modules. A snap-fitting convex portion 55 which is fitted to the snap-fitting concave portion 30e formed in the insulating cap 30 is formed in an intermediate portion of each positioning guide member 54 in the up-down direction.

In addition, in the module storage region 52, long holes 56 which extend in the left-right direction are formed at both ends of the upper plate 52c in the front-rear direction at positions that face the inner cylindrical portions 30a of the insulating caps 30, with the power semiconductor modules 2A to 2C being guided and accommodated by the pairs of positioning guide members 54. In addition, pin insertion holes 60 are formed in the upper plate 52c in the module storage region 52 so as to face the external connection terminals 45a, 45b, 46a, and 46b formed in the printed circuit board 41 of the module aggregate 40. The external connection terminals 45a, 45b, 46a, and 46b are drawn to the outside through the pin insertion holes 60.

As illustrated in FIG. 5, an insulating partition wall 62 is formed in the main terminal plate storage region 53 so as to protrude downward from an upper plate 61*a* and to be inserted between the main terminal plates 3B and 3C. In addition, an insulating partition wall 63 is formed in the main terminal plate storage region 53 so as to protrude downward from a front plate 61*b* and to be inserted between the pin-shaped conductor 19 and the pin-shaped conductors 21*a* and 21*b* in each of the power semiconductor modules 2A to 2C.

In the main terminal plate storage region 53, nut accommodation concave portions 66, which accommodate nuts 65, are formed in a substantially central portion of the upper plate 61*a* in the front-rear direction at positions corresponding to the bending plate portions 32A to 32C of the main terminal plates 3A to 3C. In addition, in the main terminal plate storage region 53, bolt insertion concave portions 67, into which the leading ends of bolts are inserted, are formed so as to be connected to the bottoms of the nut accommodation concave portions 66. In the main terminal plate storage region 53, an insulating partition wall 68 is formed which protrudes downward from the upper plate 61*a*, extends downward along the outer circumferential surfaces of the nut accommodation concave portion 66 and the bolt insertion concave portion 67, and insulates the pin-shaped conductors 18 and 20. In the main terminal plate storage region 53, insertion holes 69*a*, 69*b*, and 69*c* through which the bending plate portions 32 of the main terminal plates 3A, 3B, and 3C are respectively drawn to the outside are formed in the upper plate 61*a*.

As illustrated in FIG. 12, the module aggregate 40 is inserted into the module storage case 4 having the above-mentioned structure through the opening portion 51 and is held in the module storage case 4. That is, as illustrated in FIG. 12, the module aggregate 40 is mounted on a flat surface of a mounting table (not illustrated) and is then moved down from the upper side. Then, the bending plate portions 32A, 32B, and 32C of the main terminal plates 3A, 3B, and 3C are inserted into the insertion holes 69*a*, 69*b*, and 69*c* in the main terminal plate storage region 53 of the module storage case 4. At the same time, the external connection terminals 45*a*, 45*b*, 46*a*, and 46*b* of the printed circuit board 41 are inserted into the insertion holes 60 in the module storage region 52 of the module storage case 4. In addition, a pair of positioning guide members 54 are fitted to the fitting concave portions 30*d* of the front and rear insulating caps 30 inserted into each of the power semiconductor modules 2A to 2C.

Then, the snap-fitting convex portion 55 which is formed in the intermediate portion of each of the pair of positioning guide members 54 of the module storage case 4 in the up-down direction comes into contact with the fitting concave portion 30*d* formed in each insulating cap 30. In this state, when the module storage case 4 is further moved down, the front and rear plates 52*a* and 52*b* move down while warping to the outside. When the opening portion 51 reaches the lower ends of the power semiconductor modules 2A to 2C, the snap-fitting convex portion 55 faces the snap-fitting concave portion 30*e* formed in the insulating cap 30. Therefore, the snap-fitting convex portion 55 is fitted to the snap-fitting concave portion 30*e* of the insulating cap 30 by the elasticity of the front and rear plates 52*a* and 52*b*.

Therefore, as illustrated in FIG. 2, the power semiconductor modules 2A to 2C are accommodated and held in the module storage region 52 of the module storage case 4, with a desired space between adjacent power semiconductor modules. In this state, when the module storage case 4 is lifted up from the mounting table, the power semiconductor modules 2A to 2C are held without coming off from the module storage case 4.

Then, the nuts 65 are inserted into the nut accommodation concave portions 66 of the module storage case 4 and the bending plate portions 32A, 32B, and 32C of the main terminal plates 3A, 3B, and 3C, which protrude from the upper plate 61*a* of the module storage case 4, are bent as illustrated in FIGS. 1, 4, and 5. Then, the leading ends of the bending plate portions 32A, 32B, and 32C cover the nut accommodation concave portions 66. Therefore, it is possible to prevent the nuts 65 from coming off.

In this case, since the main terminal plates 3A, 3B, and 3C are fixed to the pin-shaped conductor 19, 20, and 18 of each of the power semiconductor modules 2A to 2C by, for example, soldering, it is possible to prevent the power semiconductor modules 2A to 2C from coming off from the module storage case 4. The distance between the power semiconductor modules 2A to 2C may be adjusted as follows. When the module aggregate 40 is formed, the arrangement positions of the power semiconductor modules 2A to 2C are adjusted depending on the distance between the pairs of positioning guide members 54 of the module storage case 4.

Any number of power semiconductor modules can be mounted in the module storage case 4. In the above-described embodiment, since nine pairs of positioning guide members 54 are formed, the pitch between the pairs of positioning guide members 54 is equal to or slightly greater than half the width of each of the power semiconductor modules 2A to 2C. In this case, it is possible to mount a maximum of five power semiconductor modules in the module storage case 4, with a slight gap between adjacent power semiconductor modules.

When the bending plate portions 32A to 32C of the main terminal plates 3A to 3C protrude from the insertion holes 69*a* to 69*c* of the module storage case 4 and the protruding portions are bent, a gap of, for example, 0.5 mm or more, which can prevent the nut 65 from coming off, may be formed between the bending plate portions 32A to 32C and the upper plate 61*a* in the main terminal plate storage region 53 of the module storage case 4, as illustrated in FIGS. 5 and 6. As such, when the gap is formed between the bending plate portions 32A to 32C and the upper plate 61*a* in the main terminal plate storage region 53 of the module storage case 4, the module aggregate 40 can be moved a distance corresponding to the gap in the up-down direction. Therefore, it is possible to ensure flexibility in the attachment of the power semiconductor modules 2A to 2C in the up-down direction.

Figure 13:
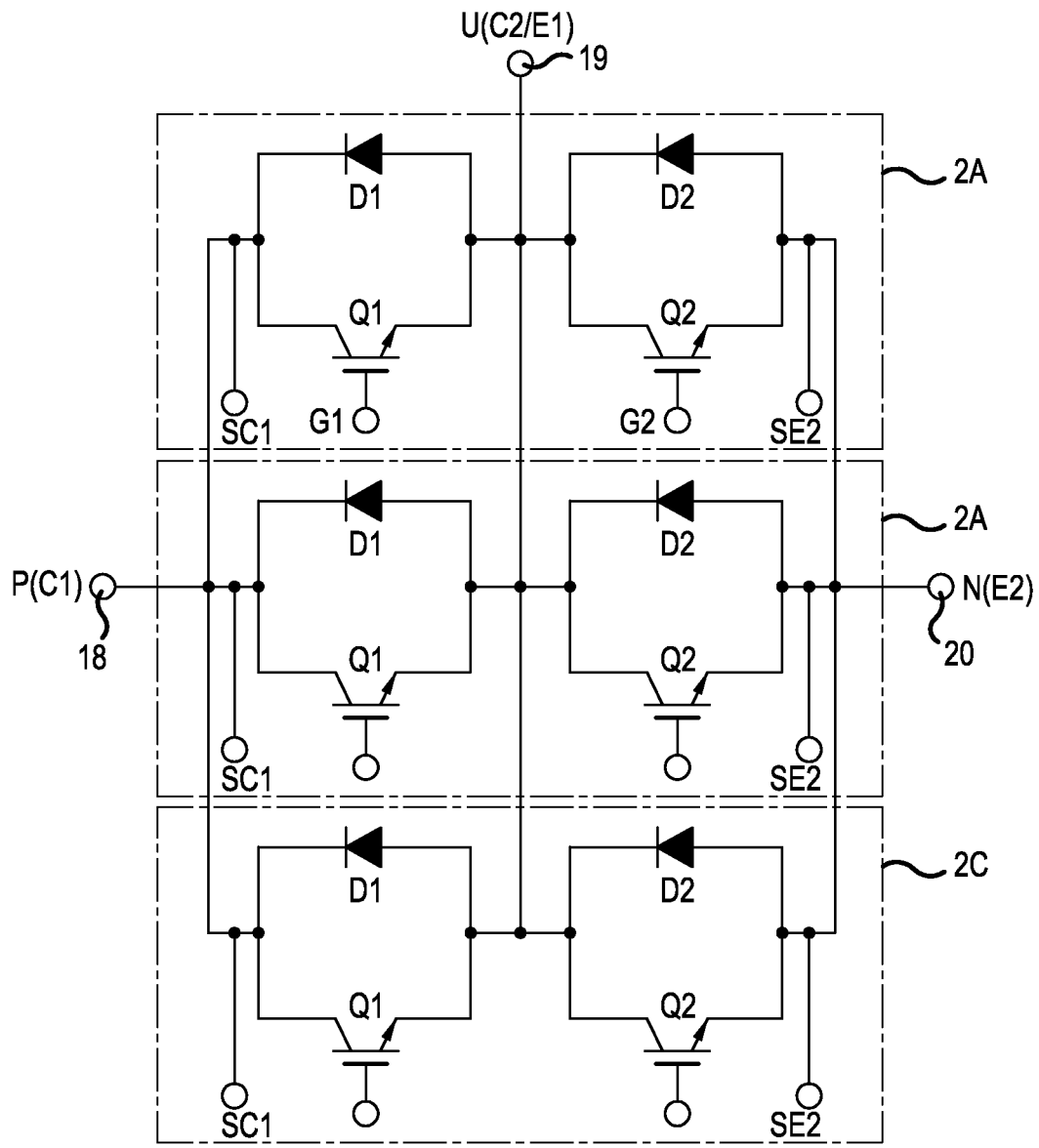
FIG. 13 is a circuit diagram illustrating an equivalent circuit of the semiconductor device.

In the state in which the module storage case 4 is mounted on the module aggregate 40, as illustrated in FIG. 4, the long holes 56 of the module storage case 4 are connected to the attachment holes 27 of the power semiconductor modules 2A to 2C in a plan view. In this way, the module aggregate 40 is accommodated and held in the module storage case 4 to form the semiconductor device 1. Since three power semiconductor modules 2A to 2C having the equivalent circuit structure illustrated in FIG. 10 are connected to each other by the main terminal plates 3A to 3C, the overall equivalent circuit of the semiconductor device 1 has a structure in which three equivalent circuits illustrated in FIG. 10 are connected in parallel to each other, as illustrated in FIG. 13.

That is, the pin-shaped conductors 18, which are the collector terminals C1 of the power semiconductor modules 2A to 2C, are electrically connected to each other by the main terminal plate 3A and are connected to a positive electrode terminal P of a DC power supply. In addition, the pin-shaped conductors 20, which are the emitter terminals E2 of the power semiconductor modules 2A to 2C, are electrically connected to each other by the main terminal plate 3B and are connected to a negative electrode terminal N of the DC power supply. The pin-shaped conductors 19, which are U-phase output terminals U (C2/E1) of the power semiconductor modules 2A to 2C, are electrically connected to each other by the main terminal plate 3C and are connected to an external output terminal U (C2/E1).

The pin-shaped conductors 21a and 21b, which are the gate terminals of the IGBTs Q1 and Q2 in each of the power semiconductor modules 2A to 2C, are connected to each other by the conductive pattern of the printed circuit board 41 and are connected to the gate terminals G1 and G2 through the external connection terminals 45a and 45b. In addition, the pin-shaped conductors 22a and 22b, which are the sense terminals of the IGBTs Q1 and Q2, are connected to each other by the conductive pattern of the printed circuit board 41 and are connected to the sense collector terminal SC1 and the sense emitter terminal SE2 through the external connection terminals 46a and 46b.

Therefore, in the semiconductor device 1, for example, it is possible to form one phase of an inverter device as a power conversion device. Here, the number of power semiconductor modules 2A to 2C accommodated in the module storage case 4 can be set on the basis of the amount of current treated by the inverter device to be configured. That is, when the amount of current is four-fifths of the amount of current of a full-featured device using five power semiconductor modules, four power semiconductor modules 2A and 2B according to the above-described embodiment may be connected by the main terminal plates 3A to 3C to form the module aggregate 40, and the module aggregate 40 may be mounted and held in the module storage case 4. Similarly, when the amount of current is three-fifths of the amount of current of the full-featured device, the main terminal plates 3A to 3C may be connected to three power semiconductor modules 2A to 2C and the module aggregate may be accommodated and held in the module storage case 4, as in the above-described embodiment. When the amount of current is two-fifths of the amount of current of the full-featured device, the main terminal plates 3A to 3C may be connected to two power semiconductor modules 2A and 2B and the module aggregate may be accommodated and held in the module storage case 4. When the amount of current is one-fifth of the amount of current of the full-featured device, the main terminal plates 3A to 3C may be connected to one power semiconductor module 2A and the module aggregate may be accommodated and held in the module storage case 4.

In the semiconductor device 1, a high voltage is applied to the main terminal plates 3A to 3C and a large amount of current flows through the main terminal plates 3A to 3C. Therefore, the problem is the insulation of the main terminal plates 3A to 3C. In this embodiment, the insulation distance, such as the creeping distance between an attachment screw 75, which is a fixing tool for the power semiconductor modules 2A to 2C, and the pin-shaped conductor 18 which is close to the attachment screw 75, can be ensured by the insulating cap 30.

As illustrated in FIG. 5, the insulating partition walls 68 and 62 are formed in the main terminal plate storage region 53 and the insulation distance between the main terminal plates 3A, 3B, and 3C is ensured by the insulating partition walls 68 and 62. In this case, the pin-shaped conductors 18 to 20 of each of the power semiconductor modules 2A to 2C protrude from the insulating base 24b which protrude from the upper surfaces of the molded bodies 24 of the power semiconductor modules 2A to 2C. Therefore, it is possible to ensure the insulation between the main terminal plates 3A to 3C and the pin-shaped conductors 18 to 20.

In the semiconductor device 1 having the above-mentioned structure, since a plurality of power semiconductor modules 2A to 2C are accommodated in the module storage case 4, the semiconductor chips 12A and 12B including an IGBT or an FWD, which form each of the power semiconductor modules 2A to 2C, generate heat. The copper blocks 16A, 16B, 23A, and 23B with high thermal conductivity are provided in order to dissipate the heat. The heat generated from the semiconductor chips 12A and 12B is transferred to the lower surfaces of the power semiconductor modules 2A to 2C through the copper blocks 16A, 16B, 23A, and 23B.

Figure 14:
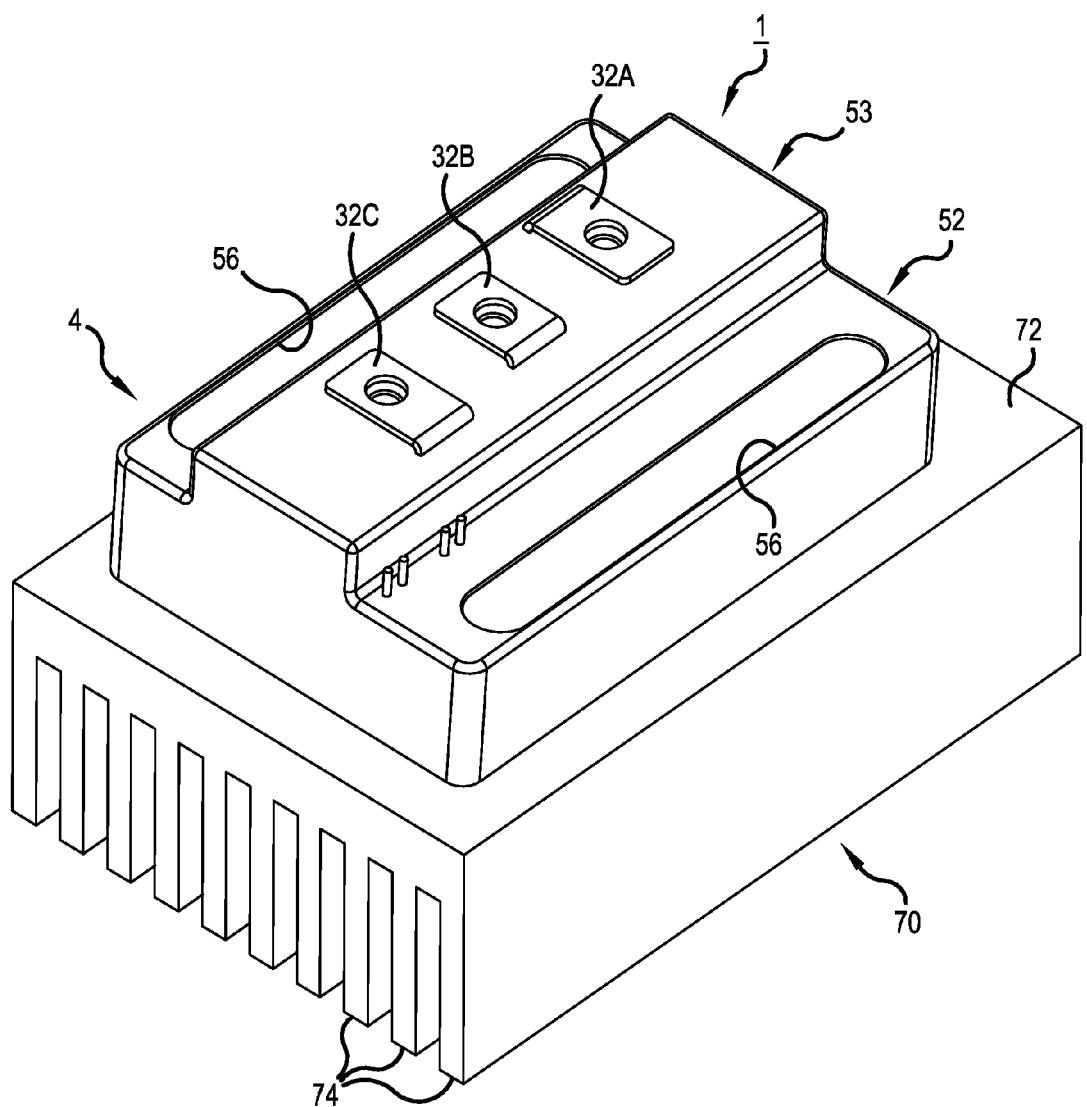
FIG. 14 is a perspective view illustrating a state in which the semiconductor devices are connected to a cooler.

As illustrated in FIG. 2, the copper blocks 23A and 23B arranged on the lower surfaces of the power semiconductor modules 2A to 2C are exposed from the opening portion 51 of the module storage case 4. Therefore, as illustrated in FIGS. 14 and 15, the copper blocks 23A and 23B, which are exposed from the lower surfaces of the power semiconductor modules 2A to 2C, come into contact with a cooler 70, such as a heat sink, with a compound 71 interposed therebetween, to effectively cool the semiconductor chips 12A and 12B which generate heat.

The cooler 70 is made of a metal material with high thermal conductivity, such as aluminum, an aluminum alloy, or copper, and is formed on a block with a parallelepiped shape. As illustrated in FIG. 14, the cooler 70 has a mounting surface 72 on which the semiconductor device 1 is mounted as its upper surface. Female screw portions 73 are formed in the mounting surface at positions facing the attachment holes 27 of the power semiconductor modules 2A to 2C of the semiconductor device 1. In addition, cooling fins 74 which extend to the lower side are formed on the rear surface side of the cooler 70 at predetermined intervals.

Figure 15:
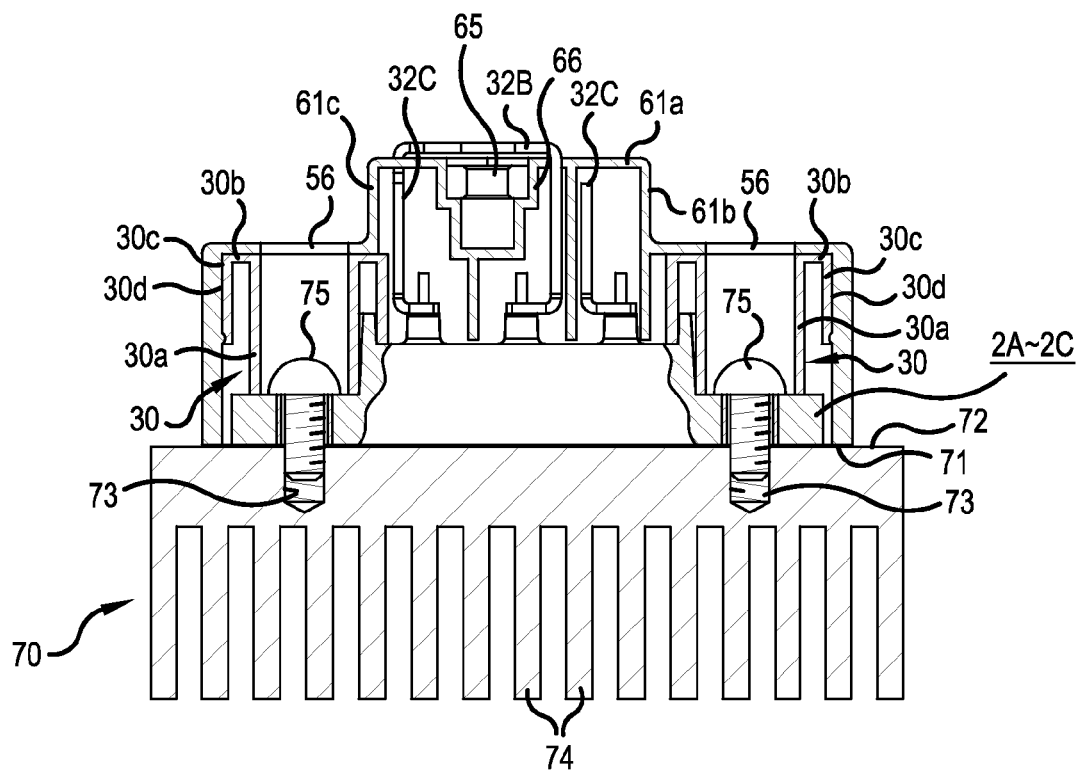
FIG. 15 is a cross-sectional view illustrating the state in which the semiconductor devices are connected to the cooler.

As illustrated in FIG. 15, the semiconductor device 1 is mounted and fixed to the mounting surface 72 of the cooler 70. The semiconductor device 1 is fixed by inserting the attachment screws 75 as the fixing tools into the attachment long holes 56 of the module storage case 4 and the attachment holes 27 of the power semiconductor modules 2A to 2C and inserting the male screw portion into the female screw portion 73 formed in the mounting surface 72 of the cooler 70.

In this case, the power semiconductor modules 2A to 2C are accommodated in the module storage region 52 of the module storage case 4 with flexibility in attachment such that the position of the power semiconductor modules 2A to 2C can be adjusted in the up-down direction. In addition, the power semiconductor modules 2A to 2C are fixed to the mounting surface 72 of the cooler 70 by the attachment screws 75, with the thermal compound 71 interposed therebetween. Therefore, the copper blocks 23A and 23B of the power semiconductor modules 2A to 2C which are exposed from the opening portion 51 of the module storage case 4 are reliably fixed to the mounting surface 72 of the cooler 70 with high thermal conductivity, with the thermal compound 71 interposed therebetween.

Therefore, it is possible to reliably dissipate heat generated from the semiconductor chips 12A and 12B, which are heating bodies of each of the power semiconductor modules 2A to 2C, to the cooler 70 through the copper blocks 16A and 16B, the conductor patterns of the insulating substrates 11A and 11B, the copper blocks 23A and 23B, and the thermal compound 71 and to prevent the overheating of the semiconductor chips 12A and 12B.

Figure 16:
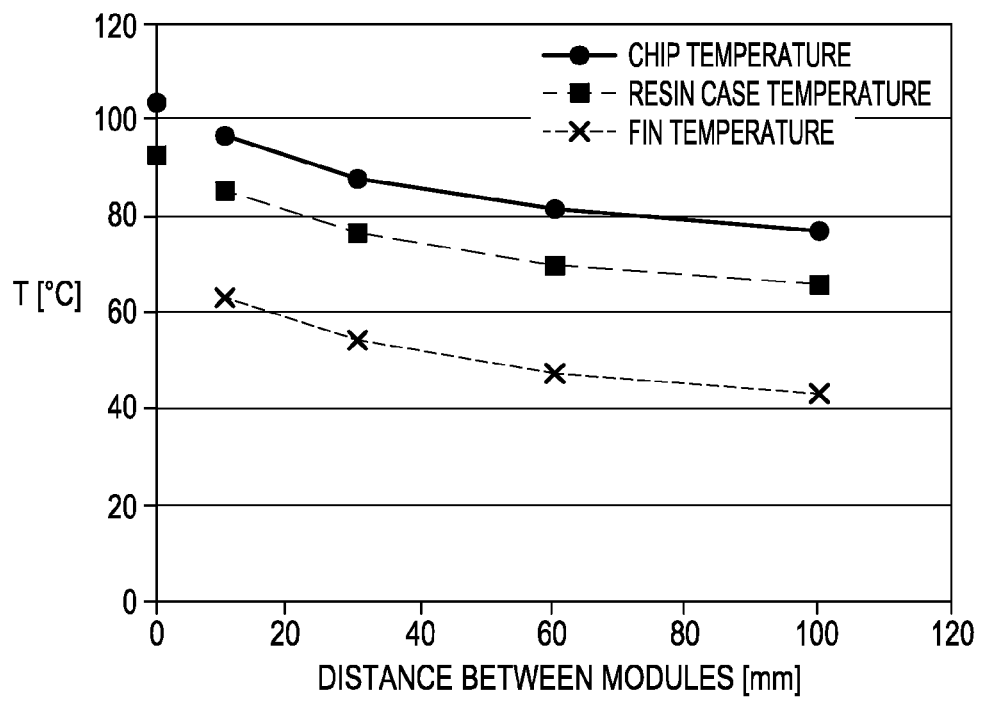
FIG. 16 is a characteristic diagram illustrating the relationship among the distance between the power semiconductor modules, a chip temperature, the temperature of the module storage case, and a fin temperature.
Figure 17:
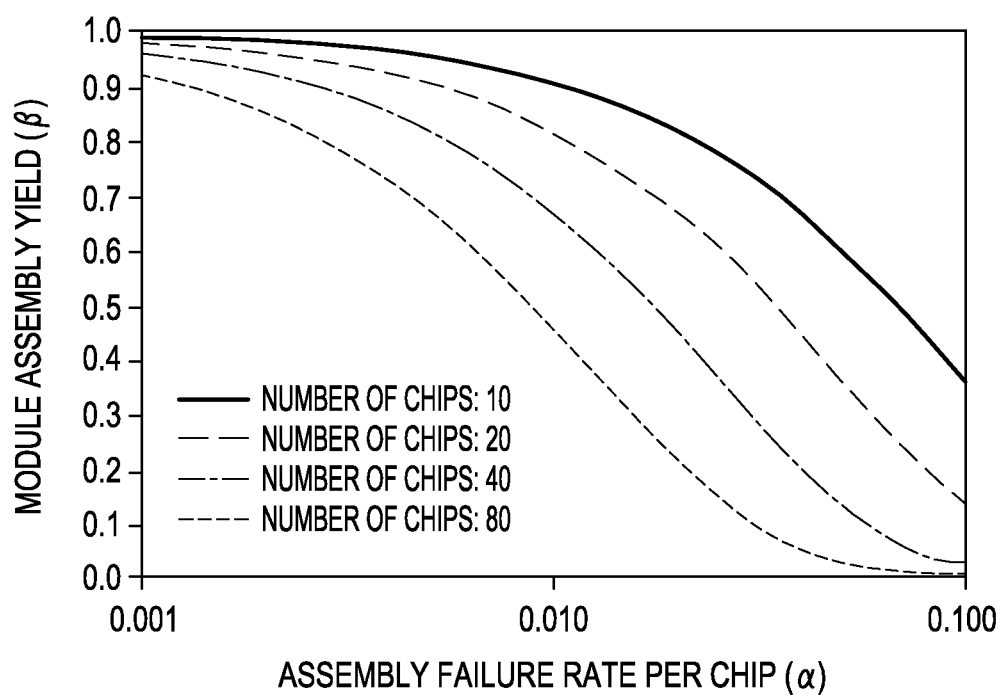
FIG. 17 is a characteristic diagram illustrating the relationship between the rate of assembly failure per chip and a module assembly yield.

Here, the distance between the power semiconductor modules 2A to 2C accommodated in the module storage case 4 is adjusted to prevent the influence of the thermal interference of heat generated from the power semiconductor modules 2A to 2C with an adjacent power semiconductor module. The relationship among the temperature Tch of the chips provided in the power semiconductor modules 2A to 2C, the temperature Tca of the module storage case 4, the temperature Tf of the lower end surface of the cooling fin 74 of the cooler 70, and the distance between the modules was measured. As illustrated in FIG. 16, it was verified that the chip temperature Tch, the case temperature Tca, and the fin temperature Tf were reduced as the distance between the modules increased from "0".

Therefore, the positions of the positioning guide members 54 for mounting the power semiconductor modules 2A to 2C are selected to adjust the distance between the modules, which makes it possible to freely design the chip temperature or the fin temperature. The pitch Lg between the positioning guide members 54 formed in the module storage case 4 may be minimized to expand the range of choices for the distance between the modules, in order to ensure flexibility in the adjustment of the temperature.

In the above-described embodiment, the module storage case 4 is not directly fixed to the cooler 70. The module storage case 4 is indirectly fixed to the cooler 70 and is not separated from the cooler 70. That is, each of the power semiconductor modules 2A to 2C is snap-fitted to the module storage case 4. Therefore, when the power semiconductor modules 2A to 2C are fixed to the cooler 70, the module storage case 4 is also fixed. In addition, the bending plate portions 32A, 32B, and 32C of the main terminal plates 3A, 3B, and 3C which are soldered to the pin-shaped conductors 18, 20, and 19 of the power semiconductor modules 2A to 2C protrude upward from the module storage case 4 through the insertion holes 69a, 69b, and 69c, are bent, and serve as the main terminal segments. In this way, the detachment of the module storage case 4 is prevented.

When the power semiconductor modules 2A to 2C are fixed to the cooler 70, the attachment screws 75 are inserted into the attachment holes 27, which are provided at both ends of each of the power semiconductor modules 2A to 2C in the longitudinal direction. In this case, the attachment hole 27 is surrounded by the insulating wall portion 25A or 25B including the C-shaped protruding portion 26a and the cap insertion concave portion 26b and the insulating cap 30 is fitted to the insulating wall portion 25A or 25B. Therefore, it is possible to reliably insulate the attachment screws 75 from the pin-shaped conductors 18 and 19 and the main terminal plates 3A and 3C.

As described above, according to the above-described embodiment, the plurality of power semiconductor modules 2A to 2C can be integrated into the module aggregate 40. Therefore, when one type of power semiconductor module with basic capacity is manufactured, the power semiconductor modules can be combined with each other to develop modules with various capacities. As a result, it is not necessary to manufacture an individual module for each capacity, unlike the related art, and it is possible to improve production efficiency.

When the plurality of power semiconductor modules 2A to 2C are accommodated and held in the module storage case 4, a pair of positioning guide members 54 for mounting the module can be selected to adjust the distance between the modules considering the cooling effect. Therefore, it is possible to freely design the chip temperature or the fin temperature. As such, when the semiconductor device 1 with a common basic structure is manufactured, it is easy to perform integration corresponding to necessary rating and it is possible to easily achieve a circuit structure for satisfying requirements for various rating levels. In addition, it is possible to adjust the distance between the modules considering the efficiency of heat transfer to the cooler and to easily prevent thermal deformation which occurs when a mounting size increases. Therefore, it is possible to improve the production efficiency, characteristics, and reliability of the semiconductor device.

The insulating caps 30 are fitted to the insulating wall portions 25A and 25B of the power semiconductor modules 2A to 2C and the fitting concave portion 30d is formed in the insulating cap 30. Therefore, it is not necessary to perform a special mounting process for the power semiconductor modules 2A to 2C. The formation of the module storage case in which an insulating portion corresponding to the insulating cap 30 is formed in the module storage region 52 makes it possible to directly mount the power semiconductor modules 2A to 2C. As a result, it is possible to achieve a versatile power semiconductor module.

A wide band gap element, such as SiC, which has drawn attention in recent years has having high efficiency, but it is difficult to make the wide band gap element as large as a Si element in terms of yield due to a crystal defect in the substrate. In order to increase capacity, a plurality of chips may be connected in parallel to each other. In some cases, for a Si element, a structure in which a plurality of small chips that are mass-produced are connected in parallel to each other has an advantage over a structure in which a large chip with a high rating is used in manufacturing costs. The structure according to the invention is effective in this case.

For example, the relational expression between the probability $\alpha$ of an assembly failure per semiconductor chip and a module assembly yield $\beta$ is represented by $\beta=(1-\alpha)^n$ (where n is the number of chips mounted). The relationship between the assembly failure rate $\alpha$ per semiconductor chip and the module assembly yield $\beta$ is represented as illustrated in FIG. 16, using the numbers of chips, 10, 20, 40, and 80, as parameters.

As can be seen from FIG. 16, when the assembly failure rate per semiconductor chip in the entire assembly process is 0.1%, the module assembly yield $\beta$ is equal to or greater than 90%, regardless of the number of chips mounted. In the case in which the assembly failure rate per semiconductor chip is 1%, when the number of semiconductor chips is 80, the module assembly yield $\beta$ is reduced to 50%. In contrast, when the number of semiconductor chips is 10, the module assembly yield $\beta$ is maintained at 90%.

Therefore, as in this embodiment, a method for minimizing the number of semiconductor chips in the power semiconductor module and combining a plurality of normal power semiconductor modules to increase capacity is advantageous in terms of costs. That is, when there are a large number of semiconductor chips in the power semiconductor module and some of the semiconductor chips are defective, the power semiconductor module is also defective. Therefore, as the number of semiconductor chips in the power semiconductor module increases, the yield is reduced.

In the above-described embodiment, the module aggregate 40 is accommodated in the module storage case 4 and the bending plate portions 32A to 32C of the main terminal plates 3A to 3C are bent. In this state, the power semiconductor modules 2A to 2C are fixed to the cooler 70. However, the invention is not limited to the above-mentioned attachment order. When the semiconductor device 1 is fixed to the cooler 70, the power semiconductor modules 2A to 2C may be fixed to the cooler 70, without bending the bending plate portions 32A to 32C of the main terminal plates 3A to 3C, and then the bending plate portions 32A to 32C may be bent.

In the above-described embodiment, the insulating cap 30 has a cylindrical shape. However, the invention is not limited thereto. The insulating cap 30 may be a polygonal cylinder with a triangular shape or a rectangular shape in a plan view, a portion of the cylindrical surface may be flat, or the insulating cap 30 may have any shape. When the shape of the insulating cap 30 is a polygonal cylinder or a portion of the cylindrical surface is flat, the shape of the insulating wall portions 25A and 25B of the power semiconductor modules 2A to 2C may be changed depending on the shape of the insulating cap 30. In this case, for example, the protrusion for stopping rotation and the concave portion can be omitted.

In the above-described embodiment, the insulating cap 30 is fitted to each of the power semiconductor modules 2A to 2C. However, the insulating cap 30 may adhere to each of the power semiconductor modules 2A to 2C. In addition, the insulating cap 30 may be formed integrally with the power semiconductor modules 2A to 2C by injection molding. In the above-described embodiment, the snap-fitting concave portion 30e and the snap-fitting convex portion 55 are formed in the fitting concave portion 30d and the positioning guide member 54, respectively. However, the fitting concave portion 30e and the fitting convex portion 55 may be omitted and the power semiconductor modules 2A to 2C may be fitted and held in the module storage case.

In the above-described embodiment, the pin-shaped conductors 21a, 21b, 22a, and 22b of each of the power semiconductor modules 2A to 2C are connected to the external connection terminals 43a, 43b, 44a, and 44b through the conductive pattern formed on the printed circuit board 41, respectively. However, the invention is not limited to the structure. The pin-shaped conductors 21a, 21b, 22a, and 22b of each of the power semiconductor modules 2A to 2C may individually protrude from the module storage case 4. In addition, the pin-shaped conductors 21a, 21b, 22a, and 22b of each of the power semiconductor modules 2A to 2C may be connected by a wire harness or other terminal pates, instead of the printed circuit board 41.

Figure 18:
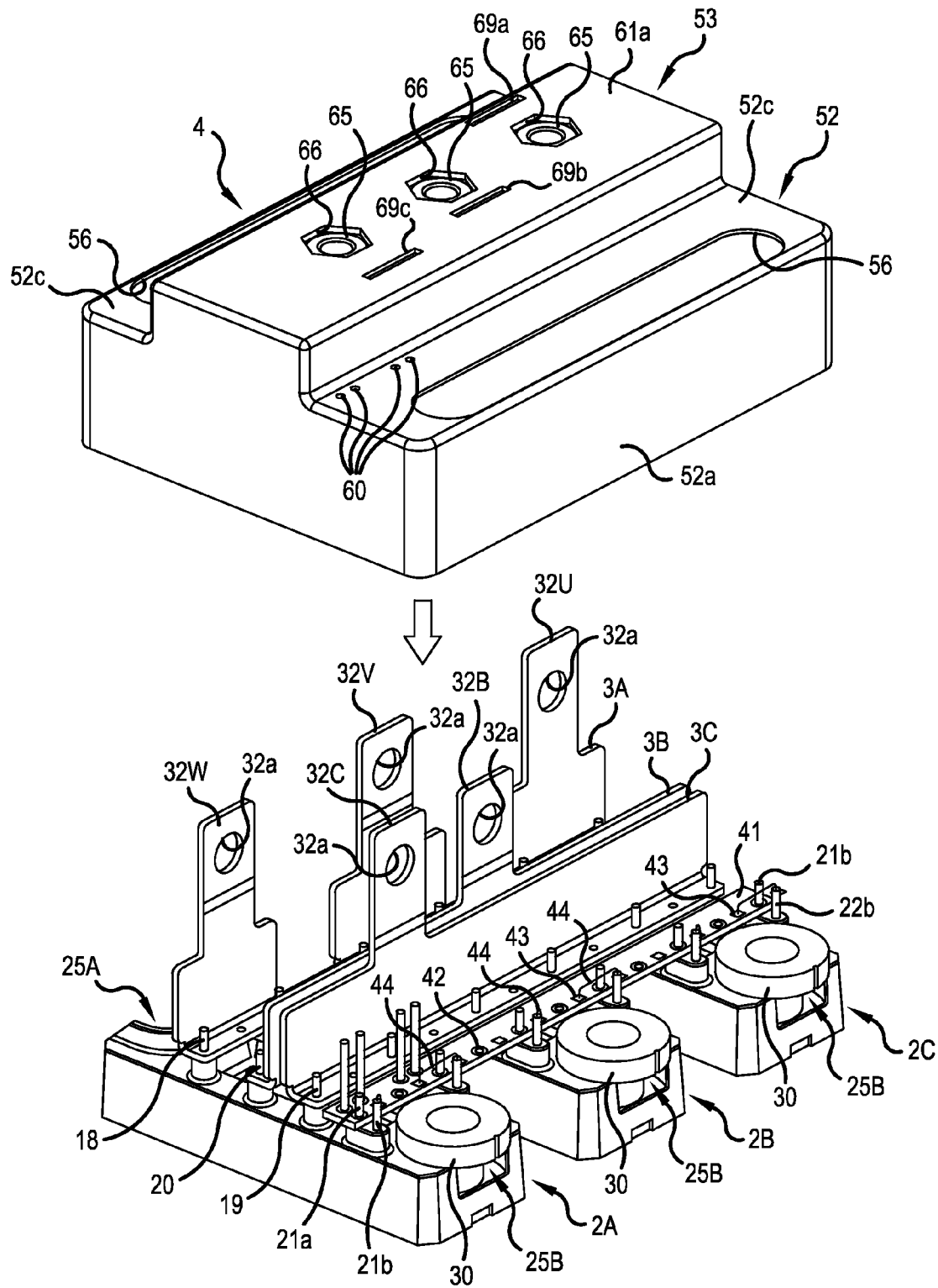
FIG. 18 is an exploded perspective view illustrating a semiconductor device according to another embodiment of the invention.

In the above-described embodiment, a plurality of power semiconductor modules are accommodated in the module storage case 4 to form one phase of the inverter device. However, the invention is not limited to the above-mentioned structure. As illustrated in FIG. 18, three power semiconductor modules 2A to 2C are used and individual main terminal plates 3A are fixed to the pin-shaped conductors 18 of each of the power semiconductor modules 2A to 2C by a fixing means, such as soldering, welding, or brazing. In correspondence with this structure, as illustrated in FIG. 18, insertion holes (not illustrated) into which the main terminal plates 3A are respectively inserted may be formed in the module storage case 4 and bending plate portions 32U, 32V, and 32W pass through the insertion holes to form a three-phase inverter device. In this case, the printed circuit board 41 is omitted. The pin-shaped conductors 21a, 21b, 22a, and 22b of each of the power semiconductor modules 2A to 2C are lengthened, instead of using the printed circuit board 41, and directly protrude upward from the module storage case 4 via through holes 81 which are formed in the upper plate 52c of the module storage case 4.

Figure 19:
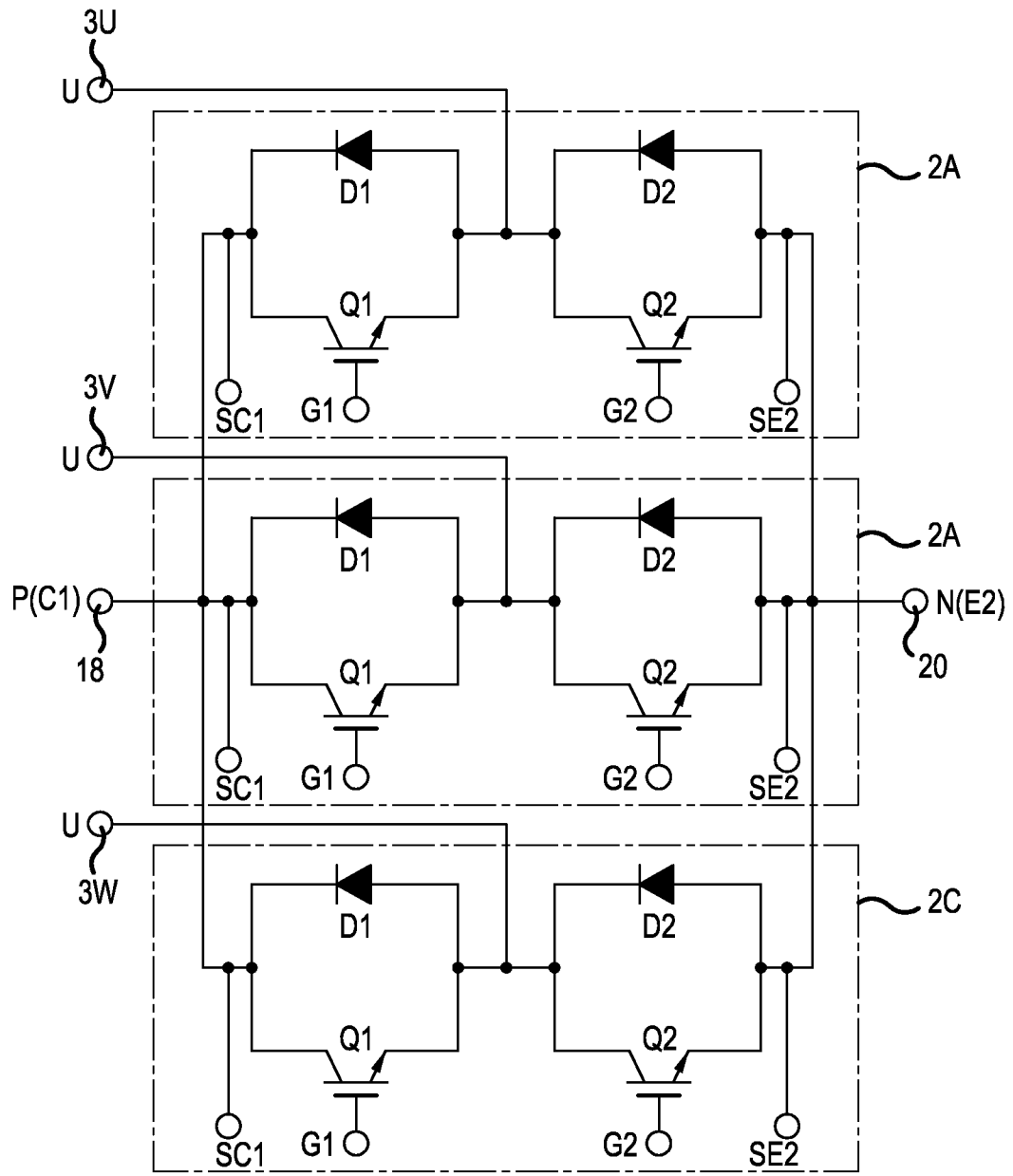
FIG. 19 is a circuit diagram illustrating an equivalent circuit of FIG. 18.

In this case, an equivalent circuit structure is as illustrated in FIG. 19 in which the equivalent circuit structures illustrated in FIG. 13 are connected in parallel to each other. For example, the power semiconductor module 2A forms a U-phase arm, the power semiconductor module 2B forms a V-phase arm, and the power semiconductor module 2C forms a W-phase arm. The main terminal plates 3U, 3V, and 3W of the power semiconductor modules 2A, 2B, and 2C are drawn as a U-phase output terminal U, a V-phase output terminal V, and a W-phase output terminal W, respectively. In addition, gate terminals G1 and G2, which are respectively connected to the pin-shaped conductors 21a and 21b of each of the power semiconductor modules 2A to 2C, are individually drawn, and sense current terminals SC1 and SE2, which are respectively connected to the pin-shaped conductors 22a and 22b, are individually drawn.

In the above-described embodiment, the main terminal plates 3A to 3C and the power semiconductor modules 2A to 2C are positioned by bringing the bottom of each connection piece 34 into contact with the upper surface of the insulating base 24b. However, the invention is not limited to the above-mentioned structure. The positioning portion can be changed as illustrated in FIG. 20.

Figure 20:
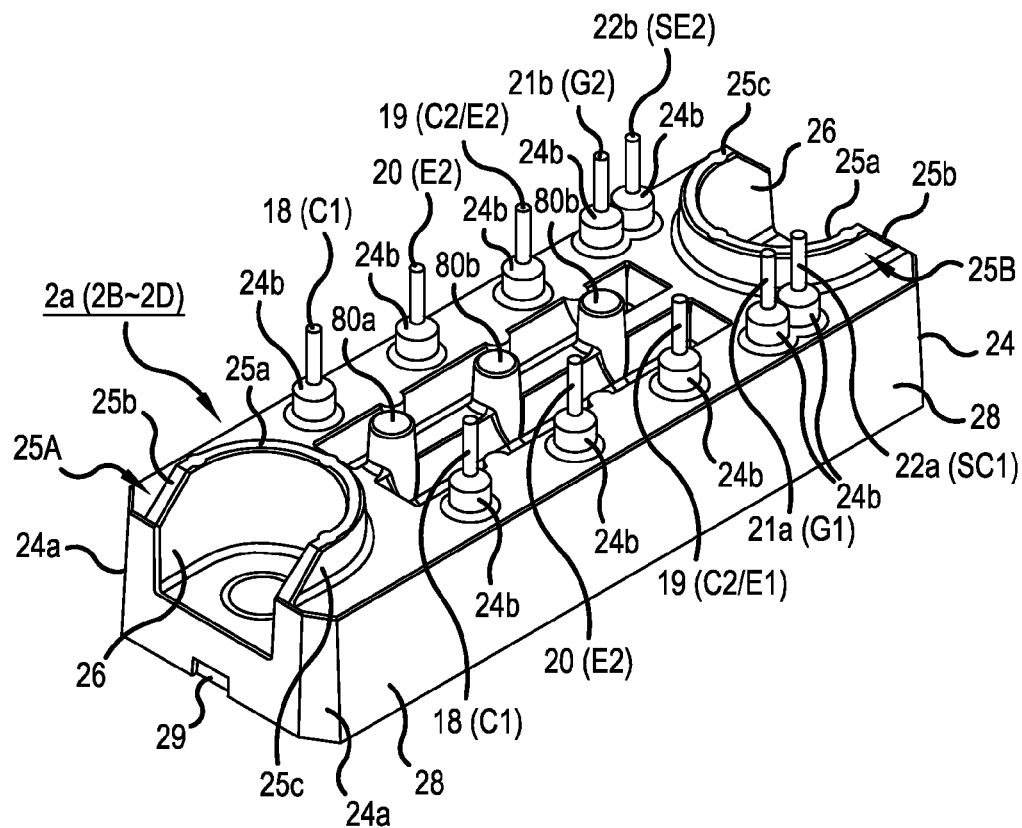
FIG. 20 is a perspective view illustrating a modification of the power semiconductor module.
Figure 21:
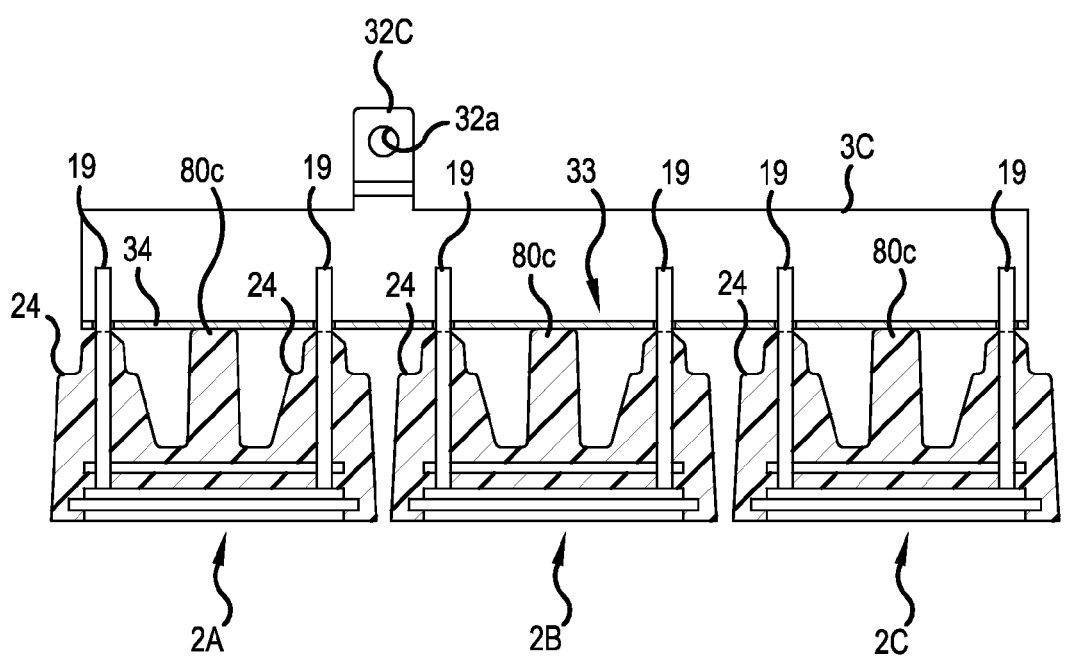
FIG. 21 is a cross-sectional view illustrating a state in which a main terminal plate is connected to a plurality of power semiconductor modules illustrated in FIG. 20.

That is, in the FIG. 20, positioning bases 80a, 80b, and 80c, each having the flat upper surface, are formed between pairs of pin-shaped conductors 18, 20, and 19 serving as the main terminals so as to protrude from the upper surface of the molded body 24. In this case, as illustrated in FIG. 21, it is possible to perform positioning by bringing the bottoms of the connection pieces 34 into contact with the upper surfaces of the positioning bases 80a, 80b, and 80c, with the pin-shaped conductors 18, 20, and 19 being inserted into insertion holes 34a which are formed in the connection pieces 34 of the main terminal plates 3A, 3B, and 3C. As such, when the positioning bases 80a to 80c are formed, it is not necessary to form positioning flat portions in the upper surfaces of the insulating bases 24b for the pin-shaped conductors 18, 20, and 19 from which the pin-shaped conductors 18, 20, and 19 protrude. Therefore, it is not necessary to mold the insulating base 24b with high accuracy and it is possible to improve ease of molding of the molded body 24.

In the above-described embodiment, the attachment holes 27 are formed at both ends of each of the power semiconductor modules 2A to 2C in the longitudinal direction. However, the invention is not limited thereto. The attachment holes may be formed at any position and an arbitrary number of attachment holes may be formed. In this case, the position of the long holes 56 in the module storage case 4 and the number of long holes 56 may be changed depending on the position of the attachment holes and the number of attachment holes.

In embodiments of the invention, a desired circuit structure may be obtained only by a combination of the terminal connections of the power semiconductor modules. The invention is not limited to the above-mentioned inverter device for power conversion, but can be applied to other power conversion devices using the power semiconductor module or other semiconductor devices, such as radio-frequency switching ICs.

According to embodiments of the invention, it is possible to provide a semiconductor device that can adjust the distance between adjacent modules among a plurality of semiconductor modules and is easy to assemble.

The invention claimed is:

1. A semiconductor device comprising:
   a semiconductor module comprising a fitting portion; and
   a module storage case configured to accommodate a plurality of the semiconductor modules and comprising a plurality of positioning guide members configured to position the semiconductor modules at selectable distances between the plurality of semiconductor modules,
   wherein a plurality of pairs of the positioning guide members are disposed on opposite sides of the module storage case so as to protrude inward and face each other, to provide the selectable distances between the plurality of semiconductor modules in a longitudinal direction, and
   wherein fitting concave portions, which are fitted to a pair of positioning guide members, are disposed at respective ends of the semiconductor module in the longitudinal direction.

2. The semiconductor device according to claim 1, wherein:
the semiconductor module comprises a semiconductor circuit having a circuit board on which at least one semiconductor chip is mounted,
the module storage case is configured to accommodate the plurality of semiconductor modules arranged in parallel.

3. The semiconductor device according to claim 2, wherein:
cap insertion concave portions are disposed in one surface of each of the plurality of semiconductor modules at both ends in the longitudinal direction,
an attachment hole, having a fixing tool inserted therein, extends through the bottom of the cap insertion concave portion to the other surface,
an insulating cap, which insulates the fixing tool, is fitted to the cap insertion concave portion, and
the fitting concave portions are formed in the insulating cap.

4. The semiconductor device according to claim 3, wherein the insulating cap comprises an inner cylindrical portion that is fitted to the cap insertion concave portion and has two open ends and an outer cylindrical portion that is connected to the outside of the inner cylindrical portion, formed coaxially with the inner cylindrical portion, and has an open lower end, and
the fitting concave portion is disposed in the outer cylindrical portion.

5. The semiconductor device according to claim 4, wherein a fitting protrusion of the module storage case comprises a snap-fitting convex portion disposed at a position corresponding to an opening portion of the outer cylindrical portion of the insulating cap, and
wherein a snap-fitting concave portion fitted to the snap-fitting convex portion is disposed in the fitting concave portion of the outer cylindrical portion of the insulating cap.

6. The semiconductor device according to claim 5, wherein the module storage case accommodates the plurality of semiconductor modules such that a heat dissipation portion disposed in each of the plurality of semiconductor modules faces the opening portion, and wherein the fixing tools are inserted into the attachment holes of the semiconductor modules, which correspond to attachment insertion holes, through the attachment insertion holes, with the heat dissipation portions coming into contact with a cooler, to fix the plurality of semiconductor modules to the cooler.

7. A semiconductor device comprising:
a semiconductor module comprising a fitting portion; and
a module storage case accommodating the semiconductor module and comprising a plurality of positioning guide members, the semiconductor module being movably coupled with the module storage case via the fitting portion such that the semiconductor module is disposed in a first location when coupled with a first positioning guide member and is disposed in a second location different from the first location when coupled with a second positioning guide member different from the first positioning guide member,
wherein the fitting portion comprises a first concave fitting portion and a second concave fitting portion spaced apart from the first concave fitting portion,
wherein the first positioning guide member comprises a first convex positioning guide member and a second convex positioning guide member,
wherein the second positioning guide member comprises a third convex positioning guide member and a fourth convex positioning guide member,
wherein the first concave fitting portion is coupled with the first convex positioning guide member and the second concave fitting portion is coupled with the second convex positioning guide member when the semiconductor module is disposed in the first location, and
wherein the first concave fitting portion is coupled with the third convex positioning guide member and the second concave fitting portion is coupled with the fourth convex positioning guide member when the semiconductor module is disposed in the second location.

8. The semiconductor device according to claim 7, wherein the first concave fitting portion and the second concave fitting portion are disposed on opposite sides of the semiconductor module from each other.

* * * * *